United States Patent
Jo

(10) Patent No.: US 12,159,666 B2
(45) Date of Patent: Dec. 3, 2024

(54) MEMORY DEVICE

(71) Applicant: Samsung Electronics Co., Ltd., Suwon-si (KR)

(72) Inventor: Sungkyu Jo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 282 days.

(21) Appl. No.: 17/546,304

(22) Filed: Dec. 9, 2021

(65) Prior Publication Data

US 2022/0359007 A1 Nov. 10, 2022

(30) Foreign Application Priority Data

May 4, 2021 (KR) .......................... 10-2021-0057715

(51) Int. Cl.
*G11C 11/00* (2006.01)
*G11C 13/00* (2006.01)

(52) U.S. Cl.
CPC ........ *G11C 13/004* (2013.01); *G11C 13/0004* (2013.01); *G11C 13/0026* (2013.01); *G11C 13/0028* (2013.01); *G11C 2213/71* (2013.01); *G11C 2213/72* (2013.01)

(58) Field of Classification Search
CPC .............. G11C 13/004; G11C 13/0004; G11C 13/0026; G11C 13/0028
USPC ....................................................... 365/163
See application file for complete search history.

(56) References Cited

U.S. PATENT DOCUMENTS

| | | | |
|---|---|---|---|
| 7,969,798 B2 | 6/2011 | Hwang et al. | |
| 9,613,691 B2 | 4/2017 | Mantegazza et al. | |
| 9,627,055 B1* | 4/2017 | Robustelli | G06F 13/1657 |
| 9,824,767 B1* | 11/2017 | Mantegazza | G11C 16/10 |
| 9,858,999 B2 | 1/2018 | Calderoni et al. | |
| 10,373,679 B1 | 8/2019 | Lee et al. | |
| 11,158,363 B2* | 10/2021 | Sforzin | G11C 16/32 |
| 2008/0316802 A1 | 12/2008 | Happ et al. | |
| 2010/0110766 A1 | 5/2010 | Wei et al. | |
| 2014/0006696 A1 | 1/2014 | Ramanujan et al. | |
| 2014/0198556 A1* | 7/2014 | Lee | G11C 16/3418 |
| | | | 365/148 |
| 2017/0243643 A1 | 8/2017 | Robustelli | |

(Continued)

OTHER PUBLICATIONS

US 9,583,185 B1, 02/2017, Robustelli (withdrawn)
Office Action dated Sep. 24, 2024 for corresponding application No. DE 102022104661.3.

*Primary Examiner* — Connie C Yoha
(74) *Attorney, Agent, or Firm* — Muir Patent Law, PLLC

(57) ABSTRACT

A memory device includes a cell region including a plurality of word lines, a plurality of bit lines, and a plurality of memory cells connected to the plurality of word lines and the plurality of bit lines disposed therein, where each of the plurality of memory cells includes a switch element and a memory element connected to each other in series between a corresponding word line and a corresponding bit line, and a peripheral circuit region including a control logic configured to, when a read command for a selected memory cell among the memory cells is received from an external controller, input a pre-voltage to the selected memory cell before reading data of the selected memory cell. The control logic is configured to determine a level of the pre-voltage with reference to an elapsed time after programming of the selected memory cell.

20 Claims, 26 Drawing Sheets

(56) References Cited

U.S. PATENT DOCUMENTS

2018/0144793 A1\* 5/2018 Jo ..................... G11C 13/0002
2019/0035461 A1 1/2019 Dallabora et al.

\* cited by examiner

MEMORY DEVICE

CROSS TO REFERENCE TO RELATED APPLICATION(S)

This application claims priority under 35 U.S.C. § 119 to Korean Patent Application No. 10-2021-0057715 filed on May 4, 2021 in the Korean Intellectual Property Office, the disclosure of which is incorporated herein by reference in its entirety.

BACKGROUND

Example embodiments of the present disclosure relate to a memory device.

A memory device may provide a function of writing and erasing data, and reading written data. A memory device may include a plurality of memory cells, and may program or erase data by adjusting a threshold voltage of each of the memory cells. A threshold voltage distribution of the memory cells may be an important factor in reading data stored in the memory cells.

SUMMARY

An example embodiment of the present disclosure is to provide a memory device which may, by determining a level of a voltage input to a selected memory cell in an initialization operation performed before a read operation in consideration of various parameters including a stabilization time of a selected memory cell from which data is to be read, improve reliability of a read operation by improving threshold voltage distribution, and a method of operating the same.

According to an example embodiment of the present disclosure, a memory device includes a cell region including a plurality of word lines, a plurality of bit lines, and a plurality of memory cells connected to the plurality of word lines and the plurality of bit lines, where each of the plurality of memory cells includes a switch element and a memory element connected to each other in series between a corresponding word line and a corresponding bit line, and a peripheral circuit region including a control logic configured to, when a read command for a selected memory cell among the plurality of memory cells is received from an external controller, input a pre-voltage to the selected memory cell before reading data of the selected memory cell. The control logic is configured to determine a level of the pre-voltage with reference to an elapsed time after programming of the selected memory cell.

According to an example embodiment of the present disclosure, a memory device includes a cell region including a plurality of memory cells connected to a plurality of word lines and a plurality of bit lines, a word line decoder connected to the plurality of word lines and configured to input a word line bias voltage to a selected word line among the plurality of word lines, a bit line decoder connected to the plurality of bit lines and configured to input a bit line bias voltage to a selected bit line among the plurality of bit lines, and a control logic configured to control the word line decoder and the bit line decoder, perform a read operation by inputting the word line bias voltage and the bit line bias voltage to a selected memory cell connected to the selected word line and the selected bit line, perform a refresh operation by inputting a pre-voltage to the selected memory cell prior to the read operation of the selected memory cell. The control logic is configured to determine a level of the pre-voltage based on at least one of a physical position of the selected memory cell, the number of accesses to the selected memory cell, and an operating temperature of the memory device.

According to an example embodiment of the present disclosure, a memory device includes a plurality of word lines extending in a first direction, a plurality of bit lines extending in a second direction intersecting the first direction, a plurality of memory cells disposed between the plurality of word lines and the plurality of bit lines in a third direction intersecting the first direction and the second direction, and a peripheral circuit region including a control logic and disposed below the plurality of memory cells in the third direction. The control logic is configured to control the plurality of memory cells, when a read command is received from an external controller, determine a selected memory cell from among the plurality of memory cells with reference to an address included in the read command and to determine a selected word line and a selected bit line connected to the selected memory cell, during a first time period, input a first word line bias voltage to the selected word line and input a first bit line bias voltage to the selected bit line, during a second time period after the first time period, input a second word line bias voltage to the selected word line and input a second bit line bias voltage to the selected bit line, and determine a level of each of the first word line bias voltage and the first bit line bias voltage based on a time point at which the read command is received.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1:
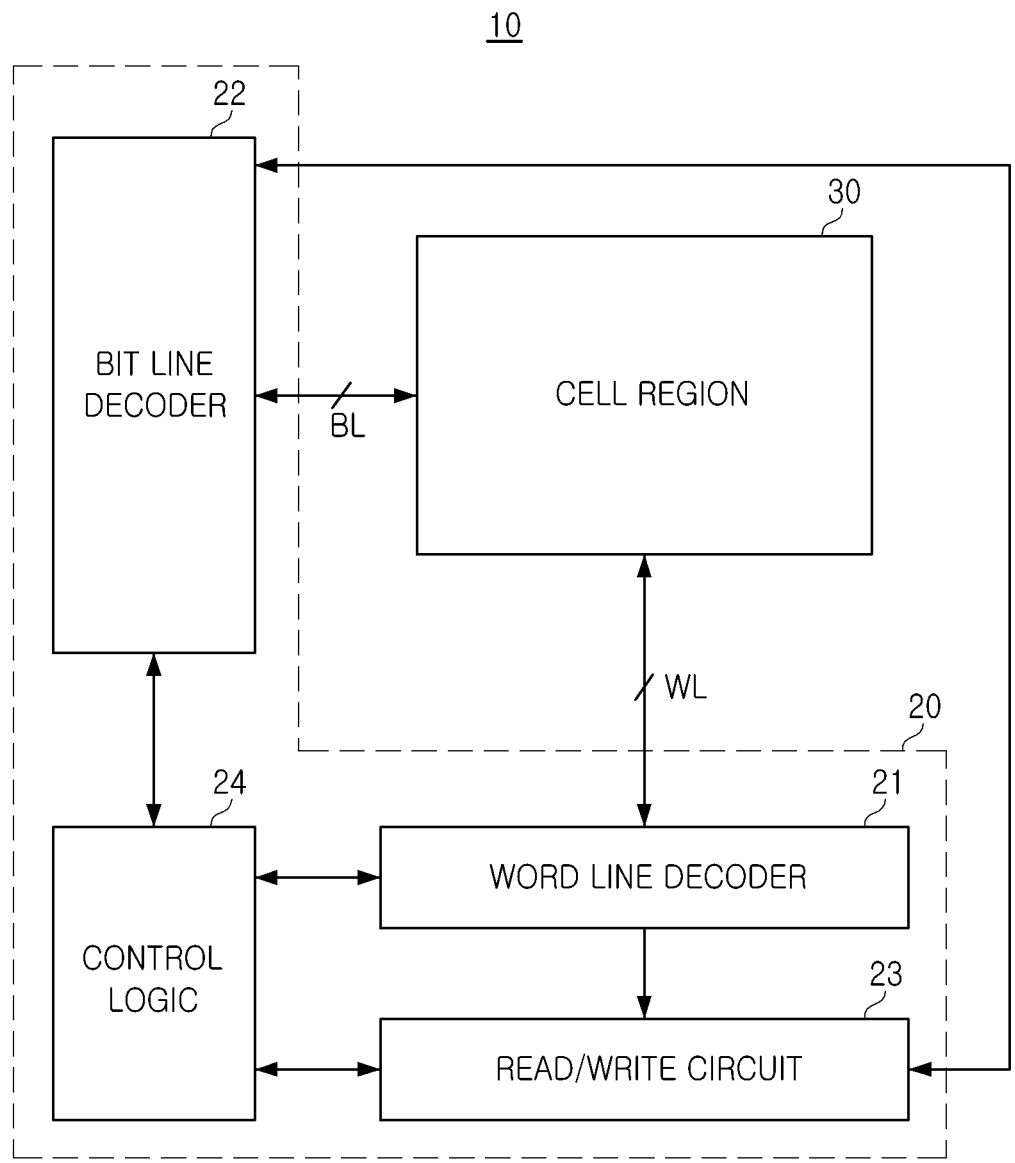
FIG. 1 is a block diagram illustrating a memory device according to an example embodiment of the present disclosure.

FIG. 1 is a block diagram illustrating a memory device according to an example embodiment.

A memory device 10 in an example embodiment may include a peripheral circuit region 20 and a cell region 30. The peripheral circuit region 20 may include a word line decoder 21, a bit line decoder 22, a read/write circuit 23, and a control logic 24. The cell region 30 may include a plurality of memory cells.

The word line decoder 21 may connect to the plurality of memory cells through word lines WL and the bit line decoder 22 may connect to the plurality of memory cells through bit lines BL. Operations of the word line decoder 21, the bit line decoder 22, and the read/write circuit 23 may be controlled by the control logic 24.

In an example embodiment, the read/write circuit 23 may include a program circuit for writing data to at least one selected memory cell specified by the word line decoder 21 and the bit line decoder 22, and readout circuit for reading data from the selected memory cell. For example, the read/write circuit 23 may electrically connect to the word line decoder 21, the bit line decoder 22, and the control logic 24 to write or read data to or from the selected memory cell of the cell region 30.

The control logic 24 may determine a selected memory cell from among the memory cells included in the cell region 30 through the word line decoder 21 and the bit line decoder 22. For example, the control logic 24 may provide a row address to the word line decoder 21 such that the word line decoder 21 may determine a selected word line based on the row address. The control logic 24 may provide a column address to the bit line decoder 22 such that the bit line decoder 22 may determine a selected bit line based on the column address. The control logic 24 may perform a program operation, a read operation, a refresh operation, or the like, on the selected memory cell by inputting a predetermined bias to each of the selected word line and the selected bit line connected to the selected memory cell.

For example, in the memory device 10, the word line decoder 21 and the bit line decoder 22 may be disposed below the cell region 30. For example, the cell region 30 may be disposed above the word line decoder 21 and the bit line decoder 22. Using the structure described above, a wiring design for connecting the word lines WL and the word line decoder 21 and the bit lines BL and the bit line decoder 22 may be simplified. In example embodiments, the read/write circuit 23 may also be disposed below the cell region 30 together with the word line decoder 21 and the bit line decoder 22.

Figure 2A:
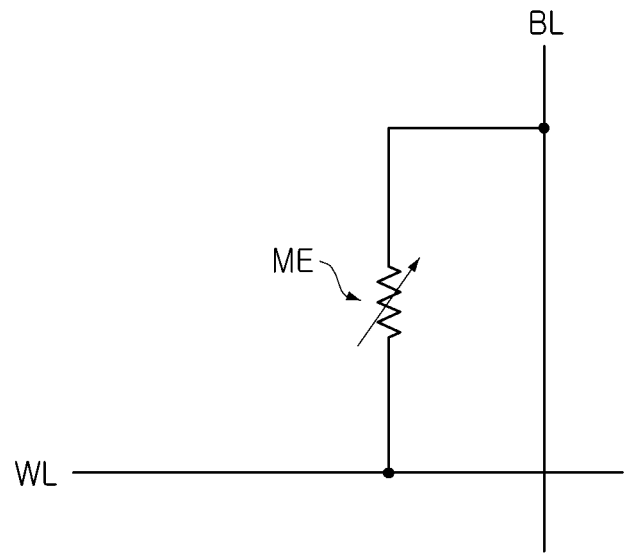
FIGS. 2A to 2C are circuit diagrams illustrating a memory cell of a memory device according to an example embodiment of the present disclosure.
Figure 2B:
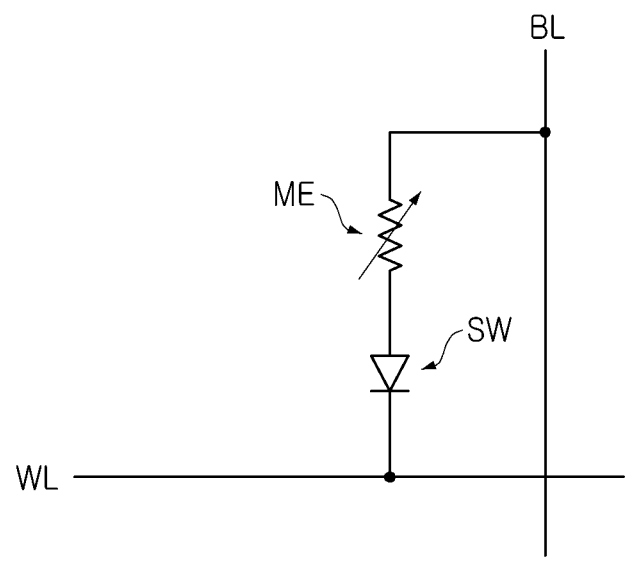
Figure 2C:
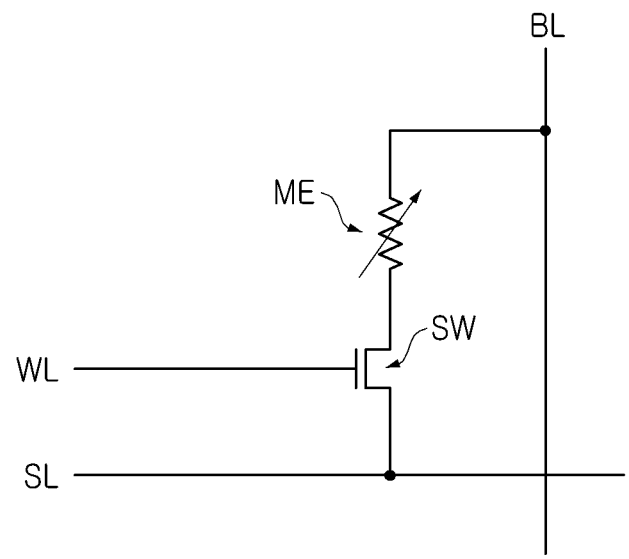

FIGS. 2A to 2C are circuit diagrams illustrating a memory cell of a memory device according to an example embodiment.

Referring to FIGS. 2A to 2C, the memory cell of the memory device in an example embodiment may include an element having characteristics of a variable resistor in which resistance may change under control of the control logic in the peripheral circuit region as a memory element ME. In the example embodiment illustrated in FIG. 2A, the memory cell may include the memory element ME having characteristics of a variable resistor, and the memory element ME may be connected between the bit line BL and the word line WL. For example, data may be written in the memory cell by adjusting resistance of the memory element ME by inputting a voltage to the bit line BL and the word line WL.

Referring to FIG. 2B, the memory cell may include a memory element ME and a switch element SW. The switch element SW may be implemented as a diode in the drawing, or may be implemented as a bidirectional diode. In an example embodiment, the switch element SW may be implemented as an ovonic threshold switch element.

Referring to FIG. 2C, a memory cell may include a memory element ME and a switch element SW implemented as a transistor. The switch element SW may operate as a selector element for supplying or blocking a current to the memory element ME according to the voltage of the word line WL. The switch element SW may be connected between the memory element ME and the source line SL, and the memory element ME may be connected between the bit line BL and the switch element SW. According to an example embodiment, the positions of the switch element SW and the memory element ME may be exchanged with each other.

The memory element ME may be implemented in various forms. For example, the memory element ME may include a material in which a phase change occurs by a voltage, such as, for example, Ge—Sb—Te (GST). In this case, the memory device may be referred to as a phase-change random access memory (PRAM). When the memory element ME includes a pair of electrodes and a transition metal oxide disposed therebetween, the memory device may be referred to as a resistive RAM (ReRAM). Also, when the memory element ME includes a magnetic material and a dielectric material, and the magnetization direction of the magnetic material changes by a voltage, the memory device may be referred to as a magnetic RAM (MRAM).

Figure 3A:
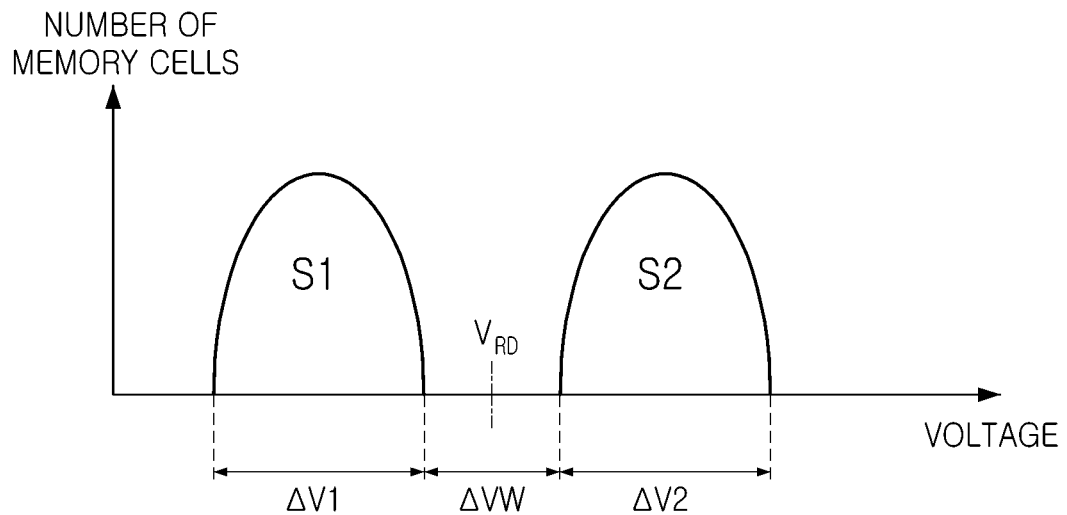
FIGS. 3A and 3B are diagrams illustrating a threshold voltage distribution of memory cells in a memory device according to an example embodiment of the present disclosure.
Figure 3B:
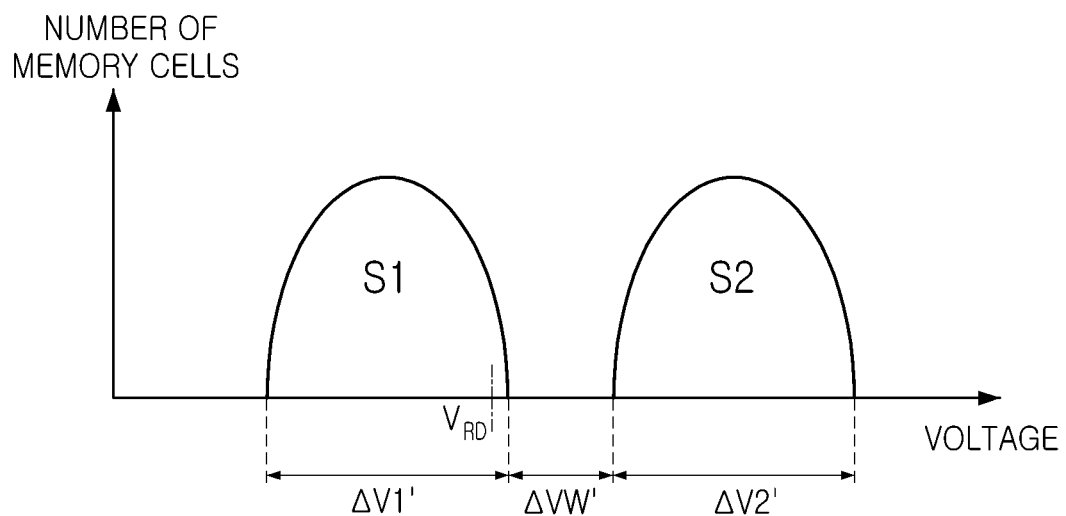

FIGS. 3A and 3B are diagrams illustrating a threshold voltage distribution of memory cells in a memory device according to an example embodiment. In FIGS. 3A and 3B, a horizontal axis represents a threshold voltage of the memory cells, and a vertical axis represents the number of memory cells. The memory cell may correspond to one of the memory cells of FIGS. 2A to 2C.

Referring to FIG. 3A, memory cells may have a first state S1 or a second state S2. For example, the memory cells in the first state S1 may have threshold voltages of a first voltage range ΔV1, and the memory cells in the second state S2 may have threshold voltages of a second voltage range ΔV2 greater than those of the first voltage range ΔV1. In an example embodiment, when the resistance of the memory cell is relatively low, the corresponding memory cell may be defined as being in a first state S1, and when the resistance of the memory cell is relatively high, the corresponding memory cell may be defined as being in the second state S2. For example, when the memory cell includes a phase change material such as GST, the phase change material may have a crystalline phase in the first state S1, and the phase change material may have an amorphous phase in the second state S2. In an example embodiment, the first state S1 may be defined as a set state, and the second state S2 may be defined as a reset state.

A predetermined voltage window ΔVW may be present between the threshold voltage of the first state S1 and the threshold voltage of the second state S2, and the read operation of the memory device may operate by inputting a read voltage $V_{RD}$ included in the voltage window to the selected memory cell. When the selected memory cell is in the first state S1, the selected memory cell may be turned on by the read voltage $V_{RD}$, whereas when the selected memory cell is in the second state S2, the selected memory cell may not be turned on by the read voltage $V_{RD}$. Accordingly, when the voltage window ΔVW between the threshold voltage of the first state S1 and the threshold voltage of the second state S2 decreases, or the first voltage range ΔV1 and/or the second voltage range ΔV2 unintentionally increases or decreases, accuracy of the read operation may be deteriorated.

For example, the threshold voltage of each of the memory cells may unintentionally increase or decrease according to an elapsed time after programming, an operating temperature, the number of accesses corresponding to the number of programming/reading of the memory cell, and the like. For example, as illustrated in FIG. 3B, when a first voltage range ΔV1' and a second voltage range ΔV2' unintentionally increase, the read voltage $V_{RD}$ may be beyond a voltage window ΔVW'. Also, the read voltage $V_{RD}$ may fall within the first voltage range ΔV1', and in this case, an error in which data is erroneously read in a read operation may occur according to the threshold voltage of the selected memory cell.

In an example embodiment, to sufficiently secure the voltage window ΔVW' and to improve reliability of the memory device, a refresh operation may be performed on the selected memory cell before the read operation. For example, the refresh operation may be of preferentially inputting a predetermined pre-voltage to the selected memory cell prior to inputting the read voltage $V_{RD}$ to the selected memory cell. The voltage window ΔVW' may increase by a pre-voltage, and accuracy of the read operation may improve.

In example embodiments, the control logic 24 may determine a level of the pre-voltage based on at least one of an elapsed time after programming on the selected memory cell, a physical position of the selected memory cell, the number of accesses to the selected memory cell, and an operating temperature of the memory device.

The level of the pre-voltage may be dynamically determined according to the amount of change in the threshold voltage generated in the selected memory cell. For example, the threshold voltage of the selected memory cell may increase significantly as the elapsed time after programming increases. Accordingly, the level of the pre-voltage input to the selected memory cell having a long elapsed time after programming may be greater than the level of the pre-voltage input to the selected memory cell having a short elapsed time after programming. The level of the pre-voltage may be determined in consideration of various parameters which may affect the amount of change in the threshold voltage in addition to the elapsed time after the programming.

Figure 4:
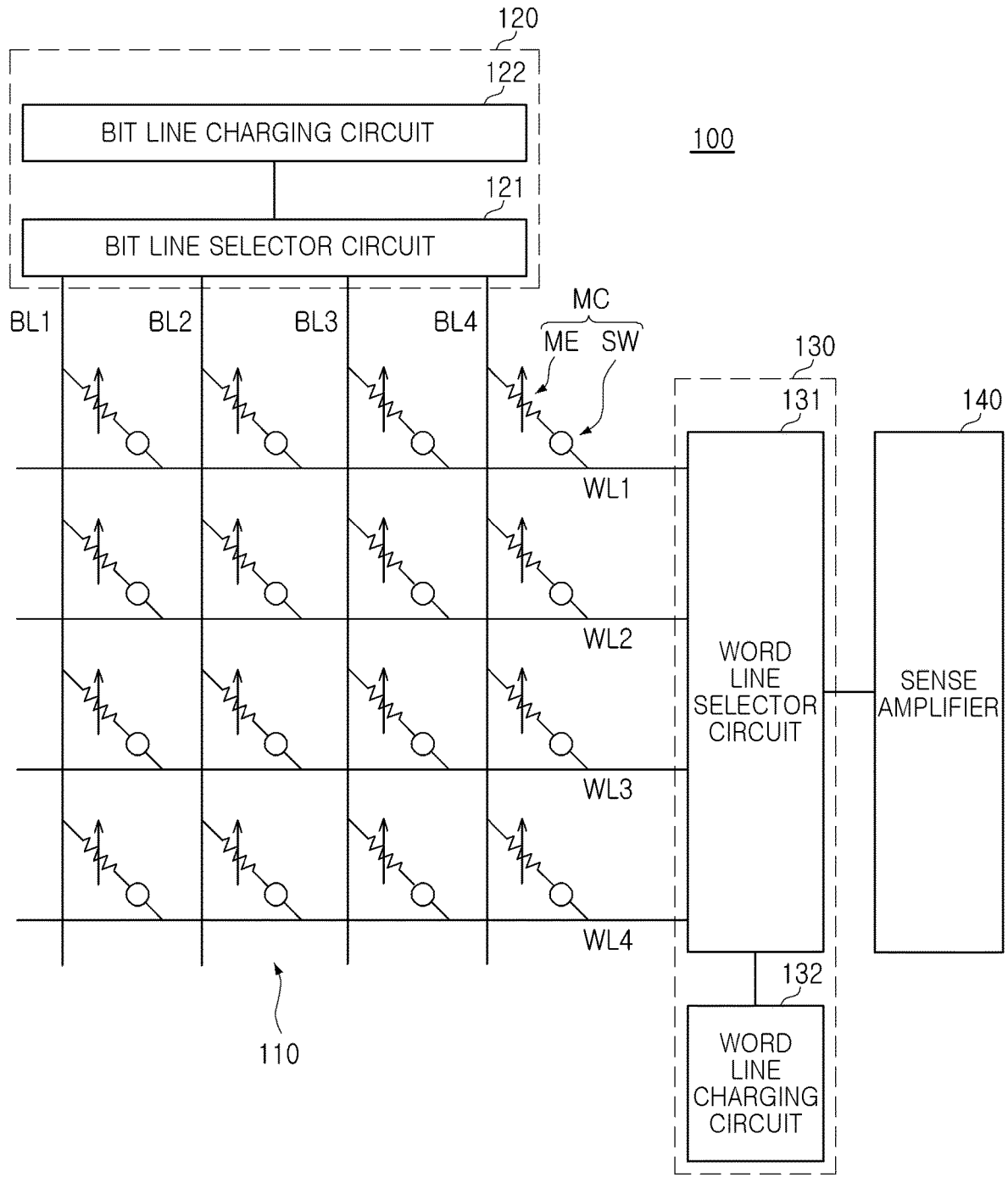
FIG. 4 is a block diagram illustrating a memory device according to an example embodiment of the present disclosure.

FIG. 4 is a block diagram illustrating a memory device according to an example embodiment.

Referring to FIG. 4, a memory device 100 in an example embodiment may include a cell region 110, a bit line decoder 120, a word line decoder 130, and a sense amplifier 140. The bit line decoder 120, the word line decoder 130, and the sense amplifier 140 may be included in the peripheral circuit region. For example, the read/write circuit 23 in FIG. 1 may include the sense amplifier 140. The cell region 110 may include memory cells MC, and each of the memory cells MC may include a switch element SW and a memory element ME. For example, the memory cells MC may correspond to the memory cell of FIG. 2B. The memory cells MC may be connected to the bit lines BL1 to BL4 and the word lines WL1 to WL4. The memory cells MC, the bit lines BL1-BL4, and the word lines WL1-WL4 illustrated in FIG. 4 are merely examples, and the number of each element may be varied in example embodiments.

The bit line decoder 120 may include a bit line charging circuit 122 and a bit line selector circuit 121 connected to the bit lines BL1-BL4. The bit line selector circuit 121 may determine a selected bit line and a non-selected bit line from among the bit lines BL1-BL4. In a program operation, a read operation, and a refresh operation, different voltages may be input to the selected bit line and the non-selected bit line. The voltages input to the selected bit line and the non-selected bit line may be determined by the bit line selector circuit 121 and the bit line charging circuit 122.

The word line decoder 130 may include a word line charging circuit 132 and a word line selector circuit 131 connected to the word lines WL1-WL4. The word line selector circuit 131 may determine a selected word line and a non-selected word line from among the word lines WL1-WL4. In a program operation, a read operation, and a refresh operation, voltages input to the selected word line and the non-selected word line may be determined by the word line selector circuit 131 and the word line charging circuit 132.

The memory device 100 in an example embodiment may perform a refresh operation before performing a read operation. The memory device 100 may perform a read operation in response to a read command received from an external controller, and the read operation may be performed on a selected memory cell selected from among the memory cells MC with reference to an address included in the read command. The memory device 100 may perform a refresh operation of inputting a predetermined pre-voltage to the selected memory cell prior to performing the read operation.

In an example embodiment, the level of the pre-voltage may be equal to or greater than the level of the read voltage input to the selected memory cell in the read operation. Also, the level of the pre-voltage may be determined based on at least one of an elapsed time after programming of the selected memory cell, an operating temperature of the memory device 100, an address of the selected memory cell, and the number of accesses counted with respect to the selected memory cell. In an example embodiment, the level of the pre-voltage may not be fixed, and may be dynamically determined in consideration of various parameters.

For example, as the elapsed time after programming increases, the threshold voltage of the selected memory cell may relatively increase, and as described above with reference to FIGS. 3A and 3B, an error may occur in a read operation. In the refresh operation in an example embodiment, as the elapsed time after the programming increases, a higher level of the pre-voltage may be input to the selected memory cell before performing a read operation on the selected memory cell. The level of the pre-voltage may be equal to or greater than the level of the read voltage, and may only act on a selected memory cell in the set state, and may decrease the threshold voltage of the selected memory cell. Accordingly, the voltage window between the set state and the reset state may increase and errors may be reduced in the read operation.

In example embodiments, the level of the read voltage may also be dynamically adjusted along with the refresh operation. For example, as the elapsed time after the programming increases, the level of the read voltage may increase. Accordingly, the read operation using an optimal read voltage may be adaptively performed according to an increase in the threshold voltage of the selected memory cell, and accuracy of the read operation may increase and performance of the memory device 100 may improve.

Figure 5:
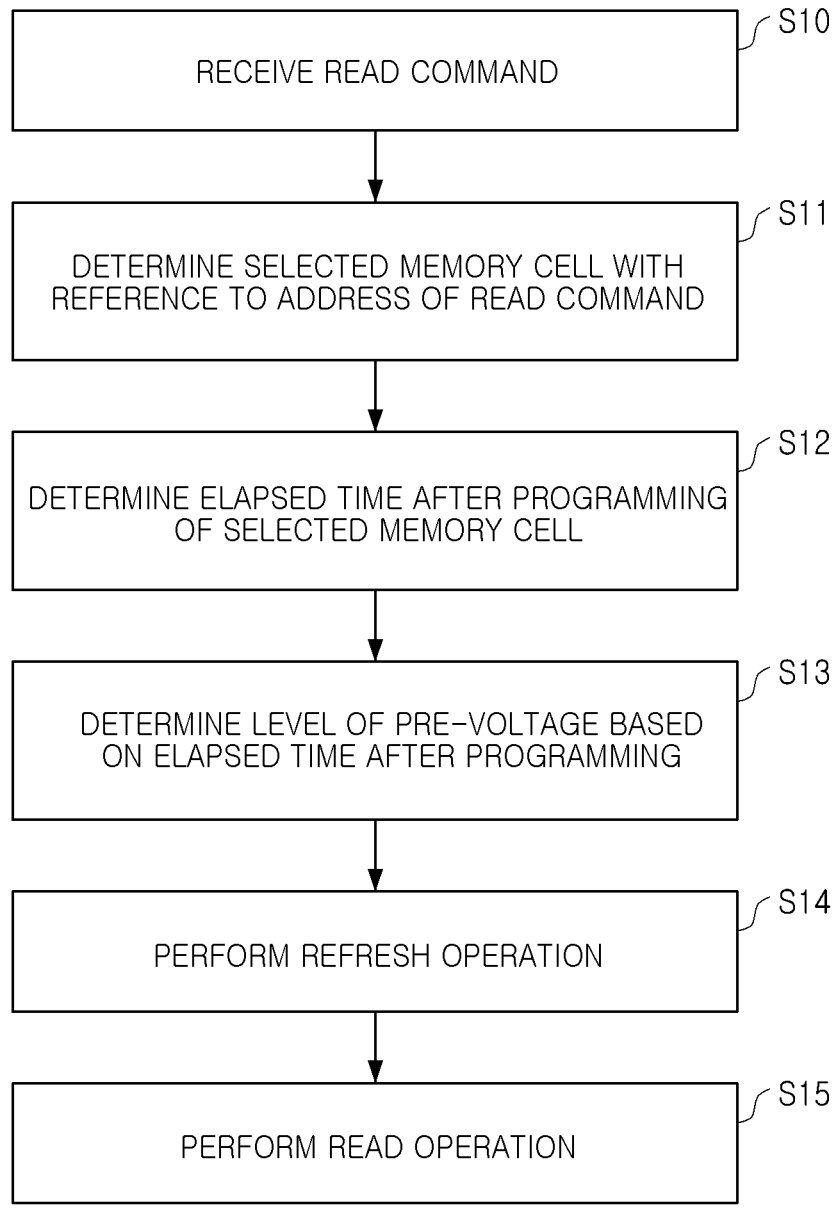
FIG. 5 is a flowchart illustrating an operation of a memory device according to an example embodiment of the present disclosure.

FIG. 5 is a flowchart illustrating an operation of a memory device according to an example embodiment.

Referring to FIG. 5, an operation of the memory device in an example embodiment may be started by receiving a read command (S10). The memory device may receive a read command from an external controller, and may determine a selected memory cell by referring to an address included in the read command (S11). For example, the memory device may receive a read command from an application processor (AP), a central processing unit (CPU), a solid state drive (SSD) controller, or the like.

When receiving the read command, the memory device may determine an elapsed time after programming for the selected memory cell (S12). For example, the elapsed time after programming may be determined from a time point at which a program command for commanding a program operation for the selected memory cell and one of a start time point or an end time point of the program operation for the selected memory cell to a time point at which the read command is received. However, in example embodiments, the time points for determining the elapsed time after the programming may be variously determined according to other criteria.

When the elapsed time after the programming is determined, the memory device may determine the level of the pre-voltage based on the elapsed time after the programming (S13). The pre-voltage may be input to the selected memory cell in a refresh operation performed prior to a read operation. For example, the shorter the elapsed time after the programming, the lower the level of the pre-voltage may be determined, and the longer the elapsed time after the programming, the higher the level of the pre-voltage may be determined.

The memory device may perform a refresh operation by inputting the pre-voltage having the determined level to the selected memory cell (S14), and may perform a read operation when the refresh operation is completed (S15). In an example embodiment, a predetermined delay time may be set between a time point at which the refresh operation is completed and a time point at which the read operation starts.

Figure 6:
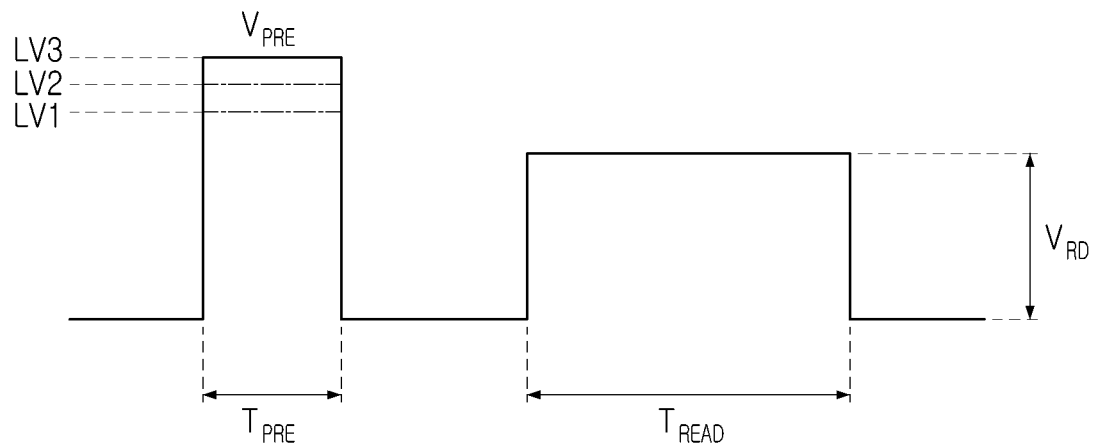
FIG. 6 is a diagram illustrating an operation of a memory device according to an example embodiment of the present disclosure.

FIG. 6 is a diagram illustrating an operation of a memory device according to an example embodiment.

As described above, the memory device in an example embodiment may include a cell region and a peripheral circuit region, and the cell region may include a plurality of memory cells. The plurality of memory cells may be connected to the peripheral circuit region through a plurality of word lines and a plurality of bit lines. The control logic in the peripheral circuit region may write data by changing a threshold voltage of each of the plurality of memory cells by adjusting a resistance of each of the plurality of memory cells. For example, by a program operation for writing data, each of the plurality of memory cells may have a set state having a plurality of threshold voltages of the first voltage range or a reset state having a plurality of threshold voltages of the second voltage range greater than those of the first voltage range.

Referring to FIG. 6, the memory device may perform a first operation and a second operation in sequence. The first operation may be a refresh operation for securing a voltage window between the first voltage range and the second voltage range by inputting a pre-voltage $V_{PRE}$ to the selected memory cell which is a target memory cell of the read operation. The second operation may be a read operation of determining the state of the selected memory cell to be one of a set state and a reset state by inputting a read voltage $V_{RD}$ to the selected memory cell.

For example, the first operation may be performed for a first time period corresponding to a pre-time $T_{PRE}$, and the second operation may be performed for a second time period corresponding to a read time $T_{READ}$. In the first operation, a level of the pre-voltage $V_{PRE}$ input to the selected memory cell may be greater than the maximum threshold voltage of the first voltage range and less than a minimum voltage of the second voltage range. In an example embodiment, a level of the pre-voltage $V_{PRE}$ may be greater than a level of the read voltage $V_{RD}$.

In an example embodiment, the level of the pre-voltage $V_{PRE}$ may not be fixed, and may be dynamically determined in consideration of various parameters. In the example embodiment illustrated in FIG. 6, the level of the pre-voltage $V_{PRE}$ may be determined as one of first to third levels LV1-LV3. The memory device may determine the level of the pre-voltage $V_{PRE}$ with reference to at least one of an elapsed time after programming of the selected memory cell, an address of the selected memory cell, the number of accesses to the selected memory cell, and an operating temperature of the memory device. For example, the operating temperature of the memory device may be an internal temperature of the memory device sensed by a temperature sensor implemented in the peripheral circuit region.

For example, as the elapsed time after programming of the selected memory cell increases, the level of the pre-voltage $V_{PRE}$ in the peripheral circuit region may be determined to be high. When the elapsed time after programming of the selected memory cell is equal to or less than a first reference time, the control logic may determine the level of the pre-voltage $V_{PRE}$ to be a first level LV1. When the elapsed time after programming is equal to or greater than a second reference time, the level of the pre-voltage $V_{PRE}$ may be determined to be the third level LV3. When the elapsed time after the programming is longer than the first reference time and shorter than the second reference time, the level of the pre-voltage $V_{PRE}$ may be determined to be the second level LV2.

Also, the memory device may determine a distance between a sense amplifier of the peripheral circuit region and the selected memory cell based on the address of the selected memory cell, and the longer the distance, the higher the level of the pre-voltage $V_{PRE}$ may be determined. In the peripheral circuit region, the higher the operating temperature of the memory device, the lower the level of the pre-voltage $V_{PRE}$ may be determined. Also, in the peripheral circuit region, the greater the number of accesses counted with respect to the selected memory cell, the lower the level of the pre-voltage $V_{PRE}$ may be determined.

As illustrated in FIG. 6, a predetermined delay time may be set between the first operation and the second operation. Referring to FIG. 6, it is illustrated that the delay time may be longer than the pre-time $T_{PRE}$ and shorter than the read time $T_{READ}$, but an example embodiment thereof is not limited thereto. For example, the delay time may be shorter than the pre-time $T_{PRE}$. Alternatively, similarly to the pre-voltage $V_{PRE}$, the delay time may also be dynamically determined. For example, the delay time may be determined with reference to the pre-voltage $V_{PRE}$.

Hereinafter, the operation of the memory device will be described in detail with reference to FIGS. 7A to 7C, 8A to 8C, and 9A to 9C along with FIG. 6.

FIGS. 7A to 7C, 8A to 8C, and 9A to 9C are diagrams illustrating operations of a memory device according to example embodiments.

Figure 7A:
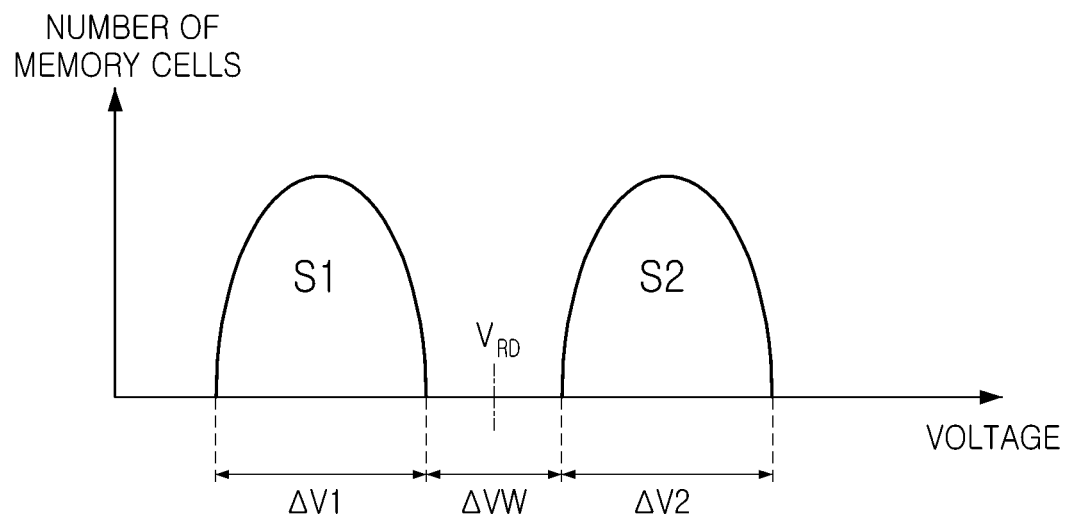
FIGS. 7A to 7C, 8A to 8C, and 9A to 9C are diagrams illustrating operations of a memory device according to example embodiments of the present disclosure.

In example embodiments described with reference to FIGS. 7A to 7C, the level of the pre-voltage $V_{PRE}$ may be determined to be the first level LV1 by at least one of an elapsed time after programming of the selected memory cell, an address of the selected memory cell, an internal temperature of the memory device, and the number of accesses to the selected memory cell. FIG. 7A may be a diagram illustrating a threshold voltage distribution of the selected memory cell immediately after a program operation on the selected memory cell is terminated. Immediately after the termination of the program operation, the threshold voltage of the selected memory cell may fall within a first voltage range ΔV1 corresponding to the first state S1 or a second voltage range ΔV2 corresponding to the second state. A voltage window ΔVW may be present between the first voltage range ΔV1 and the second voltage range ΔV2, and the read voltage $V_{RD}$ may have a level falling within the voltage window ΔVW.

The threshold voltage of the selected memory cell may increase due to a drift phenomenon occurring as time elapses after the programming. Referring to FIG. 7B, both a first voltage range ΔV1' and a second voltage range ΔV2' may increase as time elapses after the programming. In this case, a voltage window ΔVW' may be different from the voltage window ΔVW of FIG. 7A. The degree of increase in the first voltage range ΔV1' and the second voltage range ΔV2' may be varied depending on the elapsed time after the programming, and also depending on the internal temperature of the memory device, the number of accesses to the selected memory cell, and the like.

Figure 7B:
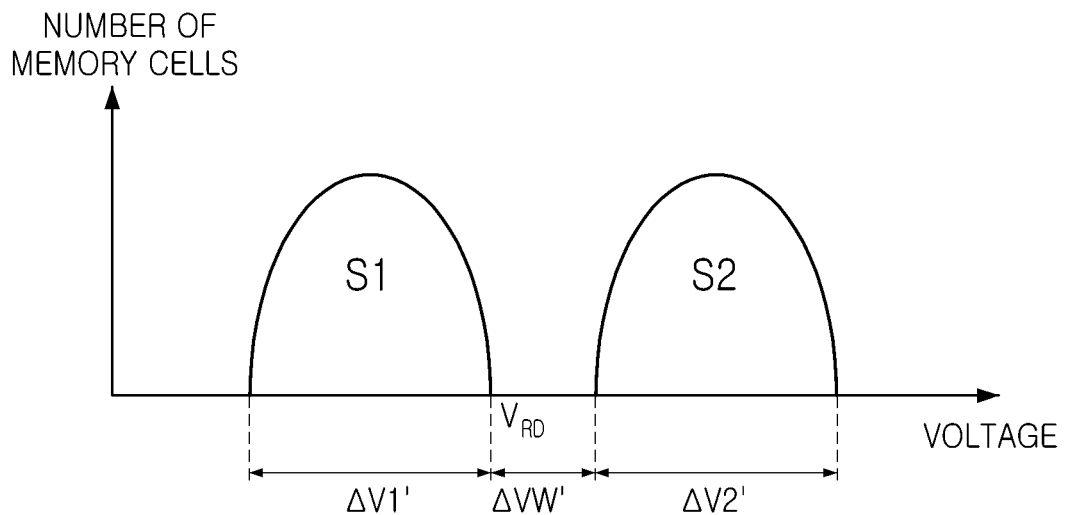
Figure 7C:
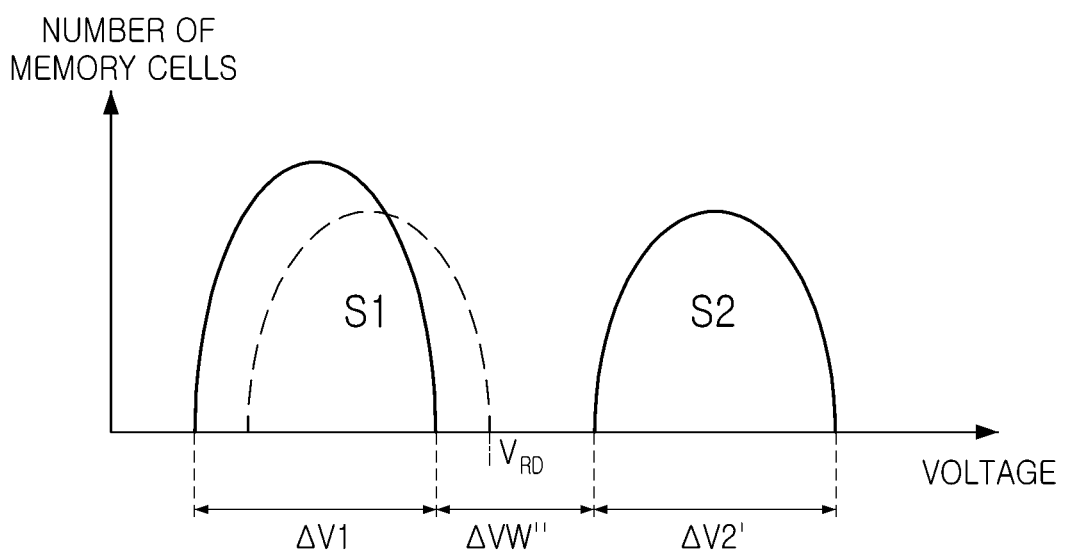

In some examples, an amount of the first voltage range ΔV1' of FIG. 7B may be similar to an amount of the first voltage range ΔV1 of FIG. 7A. In this case, threshold voltages included in the first voltage range ΔV1 may shift to higher threshold voltages included in the first voltage range ΔV1' such that threshold voltages of some memory cells included in the first voltage range ΔV1' may be greater than threshold voltages of the memory cells included in the first voltage range ΔV1.

When a read operation is performed using the read voltage $V_{RD}$ as is, an error may occur in the read operation. In an example embodiment, a refresh operation using the pre-voltage $V_{PRE}$ may be performed before performing the read operation. As described above, the level of the pre-voltage $V_{PRE}$ input to the selected memory cell in the refresh operation may be greater than the level of the read voltage $V_{RD}$ and may be less than the level of the minimum voltage of the second voltage range ΔV2'. Accordingly, as illustrated in FIG. 7C, the first voltage range ΔV1 may decrease (i.e., initialize) through the refresh operation, a voltage window ΔVW" may be sufficiently secured, and accuracy of the read operation may improve. For example, the voltage window ΔVW" of FIG. 7C may be greater than the voltage window ΔVW of FIG. 7A and the voltage window ΔVW' of FIG. 7B. In the example embodiment illustrated in FIG. 7C, the level of the pre-voltage $V_{PRE}$ may be the first level LV1 described with reference to FIG. 6.

Figure 8A:
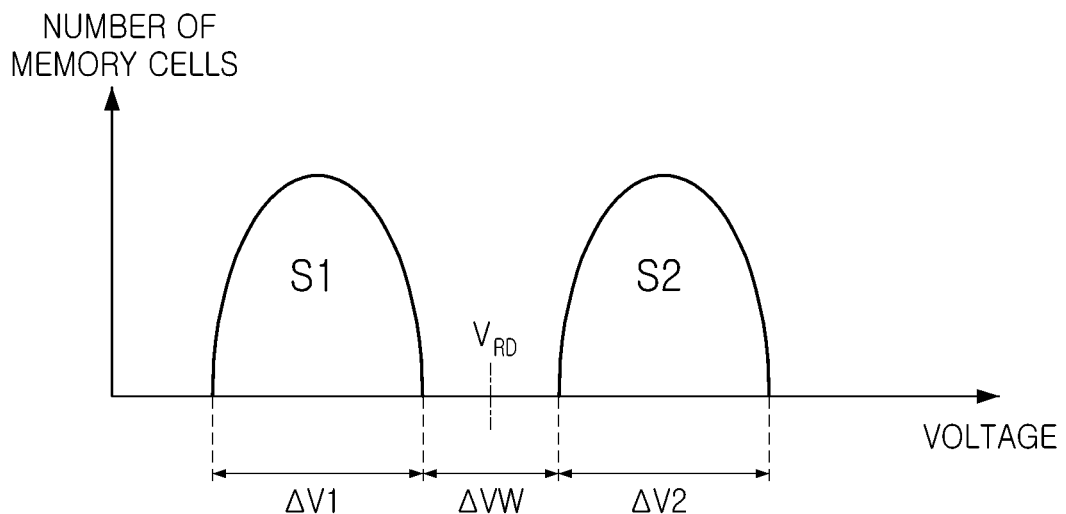

In example embodiments described with reference to FIGS. 8A to 8C, the threshold voltage of the selected memory cell after programming may increase relatively significantly as compared to the example embodiment described with reference to FIGS. 7A to 7C. That is because the elapsed time after the programming may be relatively long, the internal temperature of the memory device may be relatively low, or the number of accesses to the selected memory cell may be relatively small.

Figure 8B:
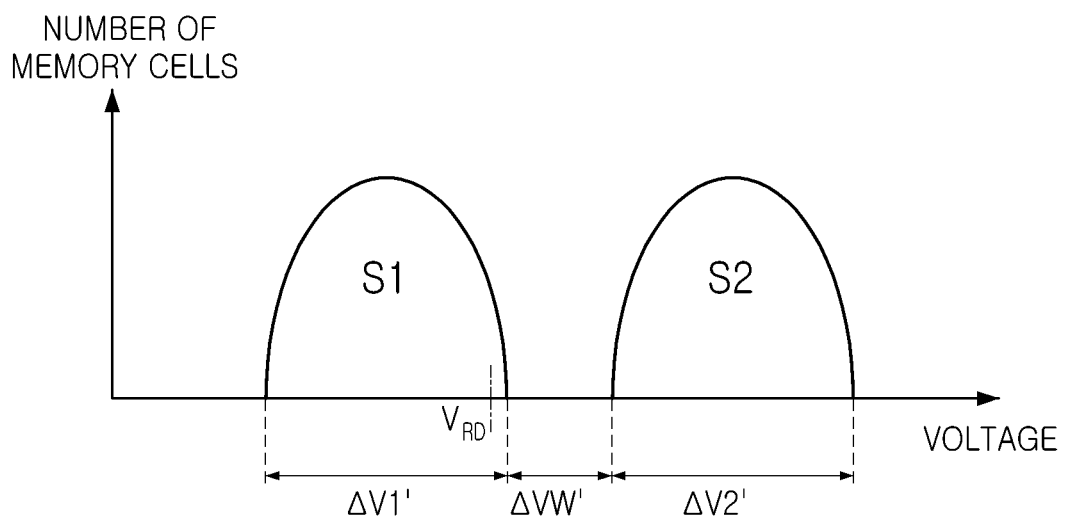
Figure 8C:
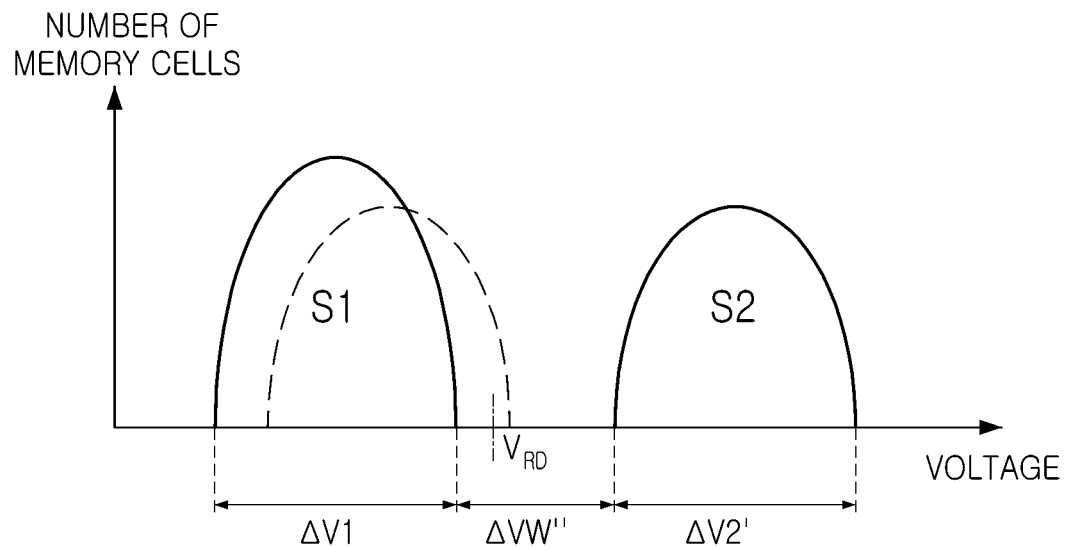

Referring to FIG. 8B, both a first voltage range ΔV1' and a second voltage range ΔV2' may increase as time elapses after the programming. In an example embodiment illustrated in FIG. 8B, the first voltage range ΔV1' and the second voltage range ΔV2' may relatively greatly increase, such that the level of the read voltage $V_{RD}$ may fall within the first voltage range ΔV1'. Therefore, when a read operation is performed using the read voltage $V_{RD}$ as is, an error may easily occur in the read operation.

In an example embodiment, to prevent an error from occurring in a read operation, a refresh operation using the pre-voltage $V_{PRE}$ may be performed before the read operation. As illustrated in FIG. 8C, the first voltage range ΔV1 may decrease (i.e., initialize) through the refresh operation, a voltage window ΔVW" may be sufficiently secured, and accuracy of the read operation may improve. For example, the voltage window ΔVW" of FIG. 8C may be greater than the voltage window ΔVW of FIG. 8A and the voltage window ΔVW' of FIG. 8B. In the example embodiment illustrated in FIG. 8C, the level of the pre-voltage $V_{PRE}$ may be the second level LV2 described with reference to FIG. 6.

Figure 9A:
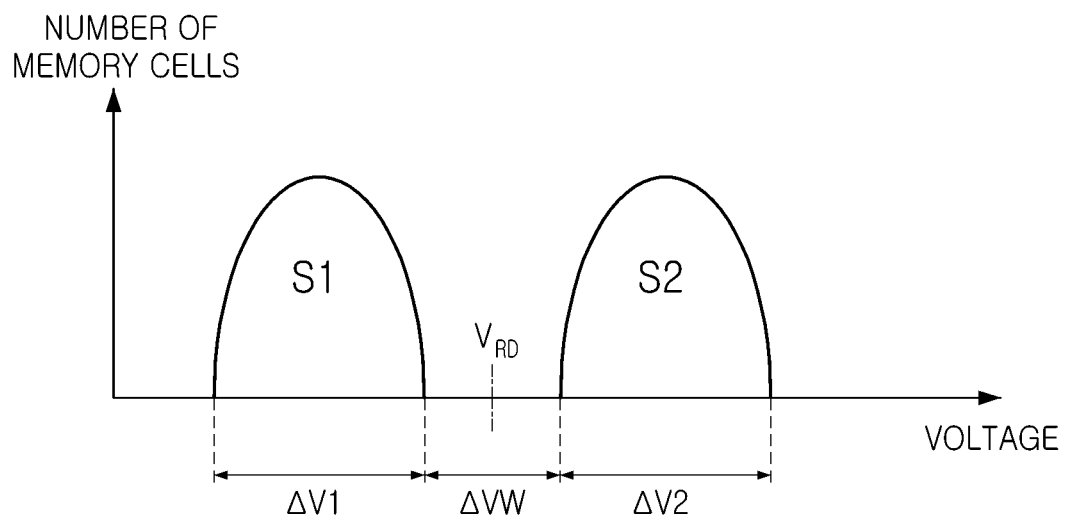
Figure 9B:
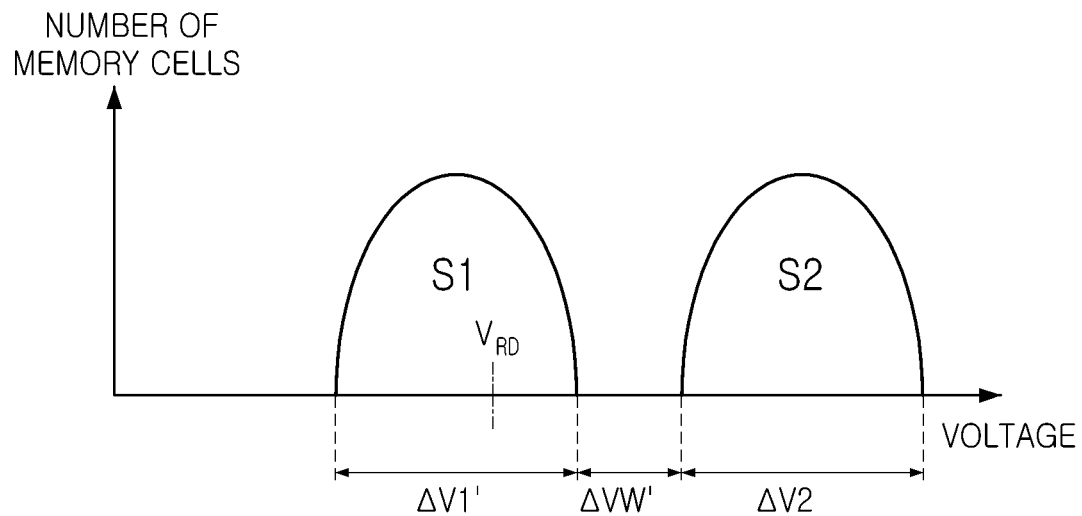

In example embodiments described with reference to FIGS. 9A to 9C, the threshold voltage of the selected memory cell after programming may increase relatively significantly as compared to the example embodiments described with reference to FIGS. 7A to 7C and FIGS. 8A to 8C. Accordingly, the level of the read voltage $V_{RD}$ may fall within a first voltage range ΔV1, and when the read operation is performed using the read voltage $V_{RD}$ as is, an error may more frequently occur in the read operation. For example, when the selected memory cell is in the first state S1, the selected memory cell may not be turned on by the read voltage $V_{RD}$, and the state of the selected memory cell may be incorrectly determined as the second state S2.

Figure 9C:
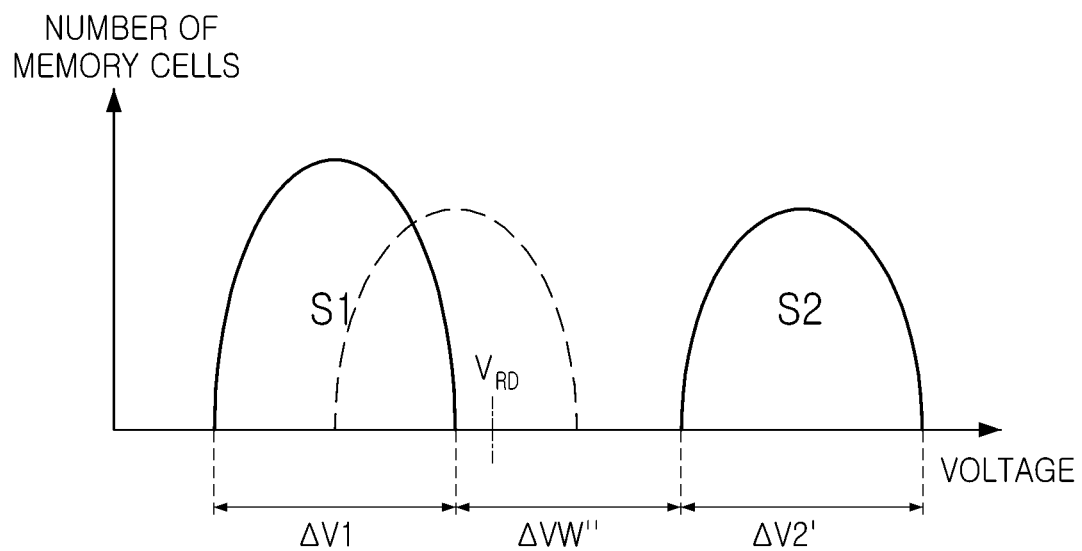

Accordingly, as illustrated in FIG. 9C, the first voltage range ΔV1 may be decreased (i.e., initialized) by the refresh operation, a voltage window ΔVW" may be sufficiently secured, and accuracy of the read operation may improve. For example, the voltage window ΔVW" of FIG. 9C may be greater than the voltage window ΔVW of FIG. 9A and the voltage window ΔVW' of FIG. 9B. In the example embodiment illustrated in FIG. 9C, the level of the pre-voltage $V_{PRE}$ may be the third level LV3 described with reference to FIG. 6. Accordingly, the first voltage range ΔV1 corresponding to the first state S1 may significantly decrease as compared to the example embodiment described with reference to FIGS. 7C and 8C, and the level of the read voltage $V_{RD}$ may fall within the voltage window ΔVW".

In example embodiments, the level of the read voltage $V_{RD}$ may be adjusted together with the level of the pre-voltage $V_{PRE}$. The level of the read voltage $V_{RD}$ may be determined in consideration of the level of the pre-voltage $V_{PRE}$. For example, as the level of the pre-voltage $V_{PRE}$ increases, the level of the read voltage $V_{RD}$ may also increase. Accordingly, in the example embodiments illustrated in FIGS. 7C, 8C, and 9C, the level of the read voltage $V_{RD}$ may be adjusted to be a level similar to a median value of the voltage window ΔVW, and accuracy of the read operation may effectively improve.

Figure 10:
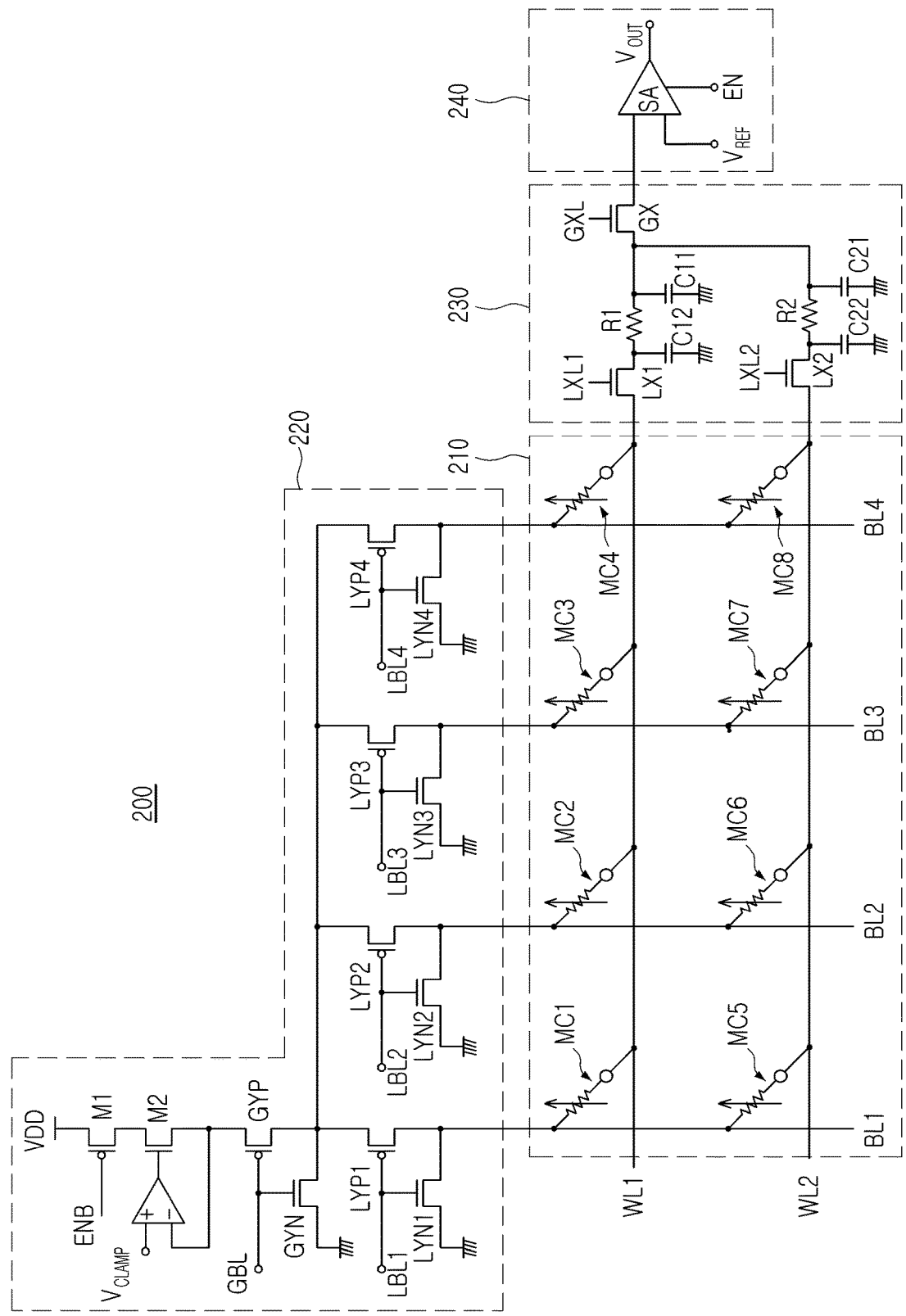
FIG. 10 is a diagram illustrating a memory device according to an example embodiment of the present disclosure.

FIG. 10 is a diagram illustrating a memory device according to an example embodiment.

Referring to FIG. 10, a memory device 200 in an example embodiment may include a cell region 210, a bit line decoder 220, a word line decoder 230, and a sense amplifier 240. As described with reference to FIG. 4, the bit line decoder 220, the word line decoder 230, and the sense amplifier 240 may be included in the peripheral circuit region. The sense amplifier 240 may be included in the read/write circuit 23.

In the example embodiment of FIG. 10, only two word lines WL1-WL2 and four bit lines BL1-BL4 are illustrated, but an example embodiment thereof is not limited thereto, and the number of the word lines and the bit lines may be varied. The cell region 210 may include memory cells MC1-MC8 respectively connected to the word lines WL1-WL2 and the bit lines BL1-BL4.

The bit line decoder 220 may determine one of the bit lines BL1-BL4 as a selected bit line and may input a bit line bias voltage. For example, the control logic 24 may provide a column address to the bit line decoder 220 such that the bit line decoder 220 may determine the selected bit line based on the column address. Similarly, the word line decoder 230 may determine one of the word lines WL1-WL2 as a selected word line. For example, the control logic 24 may provide a row address to the word line decoder 230 such that the word line decoder 230 may determine the selected word line based on the row address. The word line decoder 230 may input a word line bias voltage to the selected word line. For example, the control logic 24 may control the bit line decoder 220 and the word line decoder 230 to input the bit line bias voltage to the selected bit line and the word line bias voltage to the selected word line, respectively.

The sense amplifier 240 may compare a threshold voltage of the selected memory cell detected through the selected word line with a reference voltage $V_{REF}$, and the state of the selected word line may be determined as a set state and a reset state based on an output voltage $V_{OUT}$ of the sense amplifier 240. The sense amplifier 240 may include a comparator SA, a first input terminal of the comparator SA may be electrically connected to the word lines WL1-WL2, and a second input terminal may be connected to the reference voltage $V_{REF}$.

Each of the word lines WL1-WL2 may be connected to at least one switch element included in the word line decoder 230. For example, the first word line WL1 may be connected to the first input terminal of the sense amplifier 240 through a first local switch element LX1 and a global switch element GX. The second word line WL2 may be connected to the first input terminal of the sense amplifier 240 through a second local switch element LX2 and the global switch element GX. For example, the first word line WL1 and the second word line WL2 may share the single global switch element GX and the sense amplifier 240. Although not shown, the word line bias voltage may be provided to the word line decoder 230 such that the word line decoder 230 may input the word line bias voltage to the selected word line. For example, when the first word line WL1 is selected, the word line bias voltage may be input to the first word line WL1 through the global switch element GX and the first local switch element LX1.

In an example embodiment, a distance from the selected memory cell to the sense amplifier 240 may be defined as a distance between the selected memory cell and the first input terminal of the comparator SA, and may be varied depending on the address of the selected memory cell. For example, when the selected memory cell is the fourth memory cell MC4, the distance to the sense amplifier 240 may be shorter than the distance to the sense amplifier 240 when the selected memory cell is the fifth memory cell MC5. For example, a length of the first word line WL1 between the fourth memory cell MC4 and the sense amplifier 240 may be shorter than a length of the second word line WL2 between the fifth memory cell MC5 and the sense amplifier 240. Accordingly, when the selected memory cell is the fifth memory cell MC5, a relatively larger resistance component may act up to the first input terminal of the comparator SA, differently from the example in which the selected memory cell is the fourth memory cell MC4.

In an example embodiment, to reduce the degree of variation in the reduction of the threshold voltage by the refresh operation due to the difference in the resistance component described above, the level of the pre-voltage input to the selected memory cell in the refresh operation may be determined differently depending on the address of the selected memory cell. For example, the level of the pre-voltage of when the fourth memory cell MC4 is the selected memory cell may be lower than the level of the pre-voltage of when the fifth memory cell MC5 is the selected memory cell.

A difference in the level of the pre-voltage depending on the address of the selected memory cell may be varied depending on the word lines WL1-WL2 and also the bit lines BL1-BL4. For example, the level of the pre-voltage of when the first memory cell MC1 is the selected memory cell may be lower than the level of the pre-voltage of when the third memory cell MC3 is the selected memory cell.

An operation of inputting a bit line bias voltage to the selected bit line will be described with reference to the bit line decoder 220. Each of the bit lines BL1-BL4 may be connected to a pair of switch elements. With reference to the first bit line BL1 as an example, the first bit line BL1 may be connected to a first selection switch element LYP1 and a first non-selection switch element LYN1. The first select switch element LYP1 may be turned on when the first bit line BL1 is determined as the selected bit line, and the first non-selection switch element LYN1 may be turned on when the first bit line BL1 is determined as the non-selected bit line. For example, when the first bit line BL1 is determined as the selected bit line, the common selection element GYP and the first select switch element LYP1 may be turned on based on a column address from the control logic 24.

The first selection switch element LYP1 and the first non-selection switch element LYN1 may be implemented as different types of transistors. For example, the first selection switch element LYP1 may be implemented as a PMOS transistor, and the first non-selection switch element LYN1 may be implemented as an NMOS transistor. Gate terminals of the first selection switch element LYP1 and the first non-selection switch element LYN1 may receive the first bit line control signal LBL1 in common.

The bit lines BL1 to BL4 may share a single common selection switch element GYP and a single common non-selection switch element GYN. The common selection switch element GYP may be implemented as a PMOS transistor, and the common non-selection switch element GYN may be implemented as an NMOS transistor. The gate terminals of the common selection element GYP and the common non-selection element GYN may receive a common bit line control signal GBL in common.

The bit line bias voltage input to the selected bit line by the bit line decoder 220 may be a positive voltage. When the first bit line BL1 is determined as the selected bit line, the bit line decoder 220 may provide the bit line bias voltage having positive voltage to the first bit line BL1 through the common selection element GYP and the first selection switch element LYP1. The word line bias voltage input to the selected word line by the word line decoder 230 may be a negative voltage. When the first word line WL1 is determined as the selected word line, the word line decoder 230 may provide the word line bias voltage having negative voltage to the first word line WL1 through the global switch element GX and the first local switch element LX1. The level of each of the pre-voltage input to the selected memory cell in the refresh operation and the read voltage input to the selected memory cell in the read operation may be determined by a difference between the bit line bias voltage and the word line bias voltage.

In the description below, the read operation and the refresh operation of the memory device 200 will be described with reference to FIGS. 11 and 12A to 12C together.

FIGS. 11 and 12A to 12C are diagrams illustrating operations of a memory device according to example embodiments.

Figure 11:
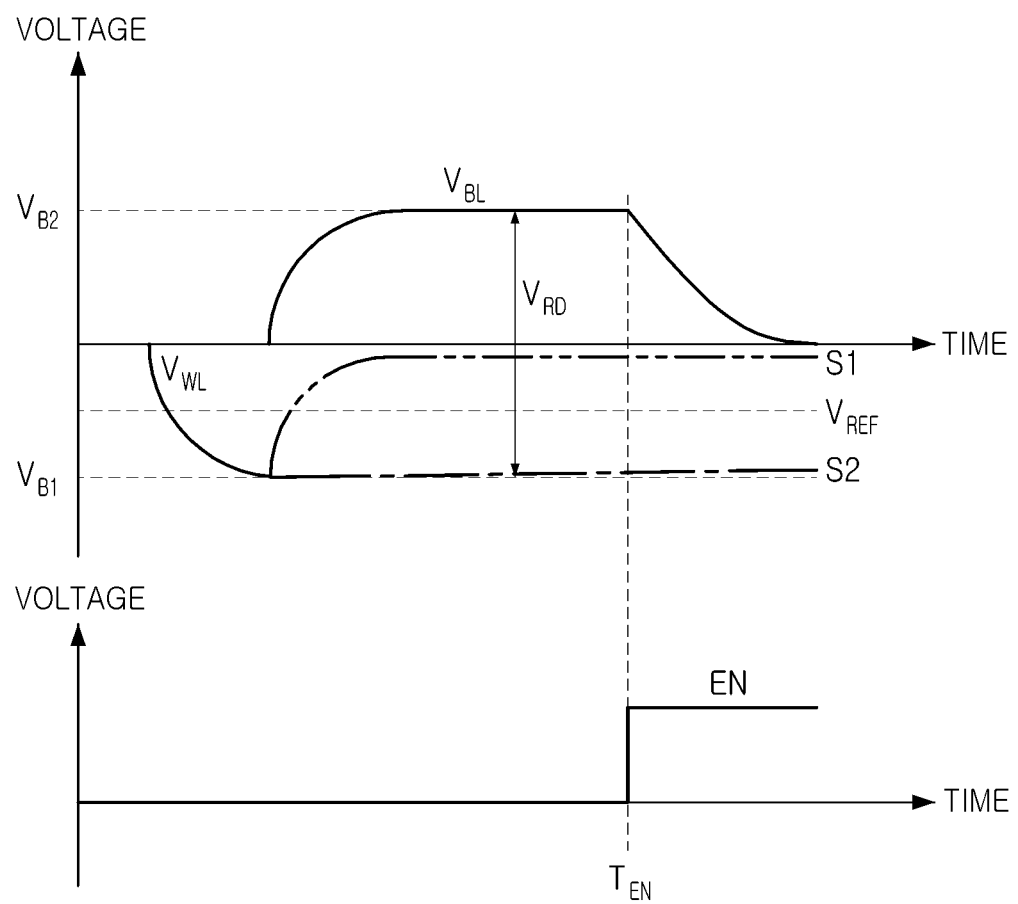
FIGS. 11 and 12A to 12C are diagrams illustrating operations of a memory device according to example embodiments of the present disclosure.

A read operation of the memory device 200 will be described with reference to FIG. 11. Referring to FIG. 11, the word line decoder 230 may pre-charge a selected word line connected to a selected memory cell to perform a read operation. For example, the selected word line may be pre-charged with a first bias voltage $V_{B1}$ which may be a negative voltage, by the word line decoder 230. When the voltage $V_{WL}$ of the selected word line reaches the first bias voltage $V_{B1}$, the word line decoder 230 may float the selected word line.

When pre-charging of the selected word line is completed, the bit line decoder 220 may pre-charge the selected bit line connected to the selected memory cell. For example, the bit line decoder 220 may pre-charge the selected bit line with a second bias voltage $V_{B2}$ which may be a positive voltage. Accordingly, as illustrated in FIG. 11, the voltage $V_{BL}$ of the selected bit line may increase up to the second bias voltage $V_{B2}$. In an example embodiment, the first bias voltage $V_{B1}$ and the second bias voltage $V_{B2}$ may have the same absolute value (magnitude).

In the example embodiment illustrated in FIG. 11, the level of the read voltage $V_{RD}$ input to the selected memory cell during the read operation may be determined by a difference between the bit line voltage $V_{BL}$ and the word line voltage $V_{WL}$. When the selected memory cell has the first state S1 which is the set state, the selected memory cell may be turned on by the read voltage $V_{RD}$ and the voltage $V_{WL}$ of the floating selected word line may increase by the bit line voltage $V_{BL}$. When the selected memory cell is in the reset state S2 which is a reset state, the selected memory cell may not be turned on by the read voltage $V_{RD}$, and the level of the voltage $V_{WL}$ of the floating selected word line may not change significantly and may be maintained at a level similar to that of the bias voltage $V_{B1}$.

At the enable time point $T_{EN}$, the comparator SA connected to the selected word line in the sense amplifier 240 may be activated by the activation signal EN. The comparator may compare the voltage $V_{WL}$ of the selected word line with the reference voltage $V_{REF}$ at the enable time point $T_{EN}$ or after the enable time point $T_{EN}$, and may output the output voltage $V_{OUT}$.

When the selected memory cell in the first state S1 is turned on and the selected memory cell in the second state S2 is not turned on by the read voltage $V_{RD}$, data of the selected memory cell may be accurately read through the read operation described with reference to FIG. 11. When the selected memory cell in the first state S1 is not turned on by the read voltage $V_{RD}$ due to an unintentional change in the threshold voltage of the selected memory cell, data of the selected memory cell may be erroneously determined.

To address the issue above, in an example embodiment, a refresh operation of inputting a pre-voltage to the selected memory cell may be performed before the read operation. The refresh operation may be of reducing a threshold voltage of the selected memory cell when the selected memory cell is in the first state S1 by inputting a predetermined bias voltage to the selected word line and the selected bit line. In the refresh operation, it may not be necessary to determine the data of the selected memory cell, and thus, the comparator SA of the sense amplifier 240 may not be activated.

Figure 12A:
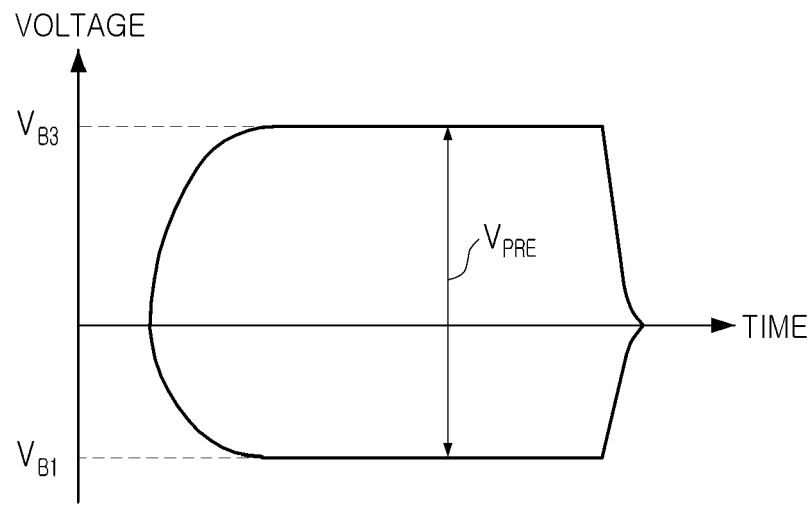
Figure 12B:
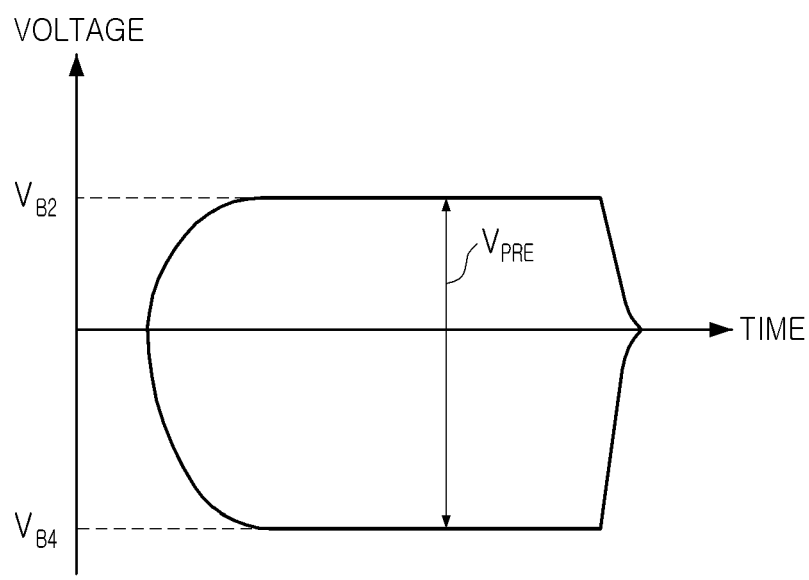
Figure 12C:
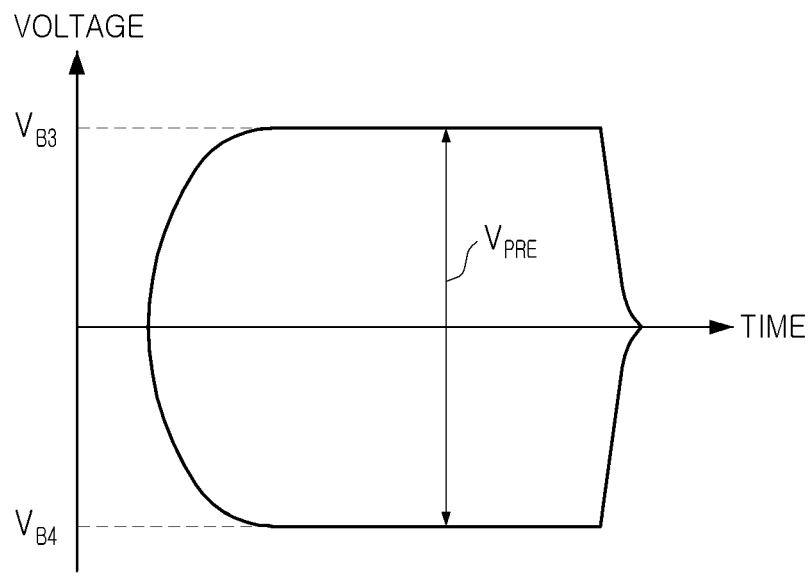

FIGS. 12A to 12C may be diagrams illustrating bias voltages input to a selected word line and a selected bit line in a refresh operation performed prior to a read operation. First, referring to FIG. 12A, in the refresh operation, a first bias voltage $V_{B1}$ may be input to a selected word line and a third bias voltage $V_{B3}$ may be input to a selected bit line. For example, when the first word line WL1 is determined as the selected word line, the word line decoder 230 may provide the first bias voltage $V_{B1}$ to the first word line WL1 through the global switch element GX and the first local switch element LX1. For example, when the first bit line BL1 is determined as the selected bit line, the bit line decoder 220 may provide the third bias voltage $V_{B3}$ to the first bit line BL1 through the common selection element GYP and the first selection switch element LYP1. The level of the third bias voltage $V_{B3}$ may be greater than the level of the second bias voltage $V_{B2}$ input to the selected bit line in the read operation. Accordingly, in the refresh operation, the level of the pre-voltage $V_{PRE}$ input to the selected memory cell may be greater than the level of the read voltage $V_{RD}$.

Referring to FIG. 12B, in the refresh operation, the fourth bias voltage $V_{B4}$ may be input to the selected word line and the second bias voltage $V_{B2}$ may be input to the selected bit line. For example, when the first word line WL1 is determined as the selected word line, the word line decoder 230 may provide the fourth bias voltage $V_{B4}$ to the first word line WL1 through the global switch element GX and the first local switch element LX1. For example, when the first bit line BL1 is determined as the selected bit line, the bit line decoder 220 may provide the second bias voltage $V_{B2}$ to the first bit line BL1 through the common selection element GYP and the first selection switch element LYP1. The level of the fourth bias voltage $V_{B4}$ may be greater than the level of the first bias voltage $V_{B1}$ input to the selected bit line in the read operation. Accordingly, the level of the pre-voltage $V_{PRE}$ may be greater than the level of the read voltage $V_{RD}$.

Referring to FIG. 12C, in the refresh operation, the fourth bias voltage $V_{B4}$ may be input to a selected word line and the third bias voltage $V_{B3}$ may be input to a selected bit line. For example, when the first word line WL1 is determined as the selected word line, the word line decoder 230 may provide the fourth bias voltage $V_{B4}$ to the first word line WL1 through the global switch element GX and the first local switch element LX1. For example, when the first bit line BL1 is determined as the selected bit line, the bit line decoder 220 may provide the third bias voltage $V_{B3}$ to the first bit line BL1 through the common selection element GYP and the first selection switch element LYP1. The level of the third bias voltage $V_{B3}$ may be greater than the level of the second bias voltage $V_{B2}$ input to the selected bit line in the read operation, and the level of the fourth bias voltage $V_{B4}$ may be greater than the level of the first bias voltage $V_{B1}$ input to the selected bit line in the read operation. Accordingly, the level of the pre-voltage $V_{PRE}$ may be greater than the level of the read voltage $V_{RD}$.

As described with reference to FIGS. 12A to 12C, to determine the level of the pre-voltage $V_{PRE}$ to be greater than the level of the read voltage $V_{RD}$, the level of at least one of the word line bias voltage input to the selected word line and the bit line bias voltage input to the selected bit line may be determined differently in each of the refresh operation and the read operation.

Figure 13:
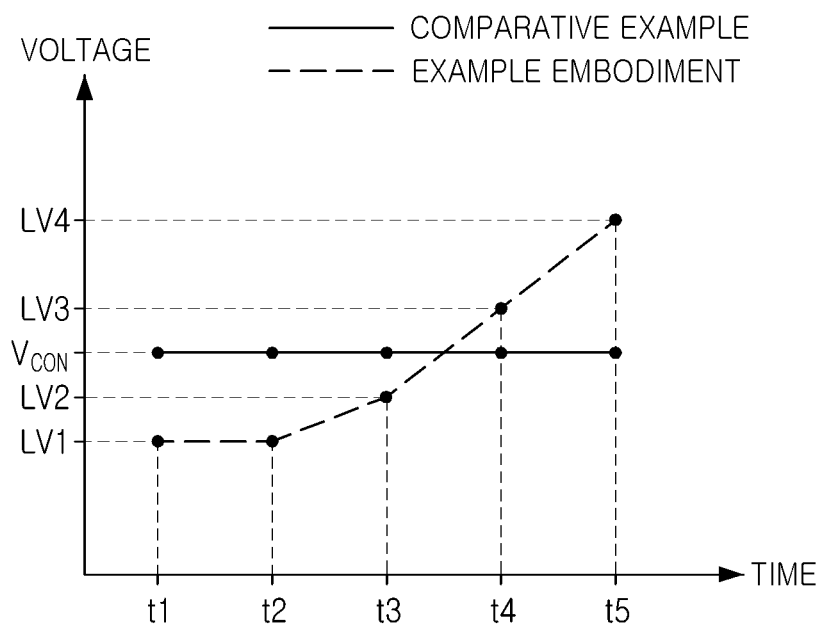
FIG. 13 is a diagram illustrating an operation of a memory device according to an example embodiment of the present disclosure.

FIG. 13 is a diagram illustrating an operation of a memory device according to an example embodiment.

In a graph illustrated in FIG. 13, the horizontal axis may correspond to time, and the vertical axis may correspond to voltage. In detail, the time on the horizontal axis may represent the elapsed time after programming of the selected memory cell, and the voltage on the vertical axis may represent the level of a pre-voltage input to the selected memory cell in a refresh operation.

Referring to FIG. 13, in the comparative example corresponding to a general method, a pre-voltage having a constant level $V_{CON}$ may be input to the selected memory cell regardless of the elapsed time after programming. However, in an example embodiment, as the elapsed time after the programming increases from a first reference time t1 to a fifth reference time t5, the level of the pre-voltage may also increase. For example, when the elapsed time after the programming is equal to or less than the second reference time t2, the pre-voltage of the first level LV1 may be input to the selected memory cell, and when the elapsed time after the programming is the third reference time t3, the pre-voltage of the second level LV2 greater than the first level LV1 may be input to the selected memory cell. Similarly, when the elapsed time after the programming is the fourth reference time t4, the pre-voltage of the third level LV3 greater than the second level LV2 may be input to the selected memory cell, and when the elapsed time after the programming is the fifth reference time t5, the pre-voltage of the fourth level LV4 greater than the third level LV3 may be input to the selected memory cell.

Accordingly, the refresh operation may be performed with the pre-voltage having an optimal level based on the increase in the threshold voltage according to the elapsed time after the programming, and the voltage window of the selected memory cell may be sufficiently secured, such that accuracy of the read operation may improve. Also, when the increase in the threshold voltage of the selected memory cell is not expected to be large, for example, when the elapsed time after the programming is equal to or less than the second reference time t2, the refresh operation may be performed with a pre-voltage of a low level, such that the power consumption of the memory device may be efficiently managed.

Figure 14:
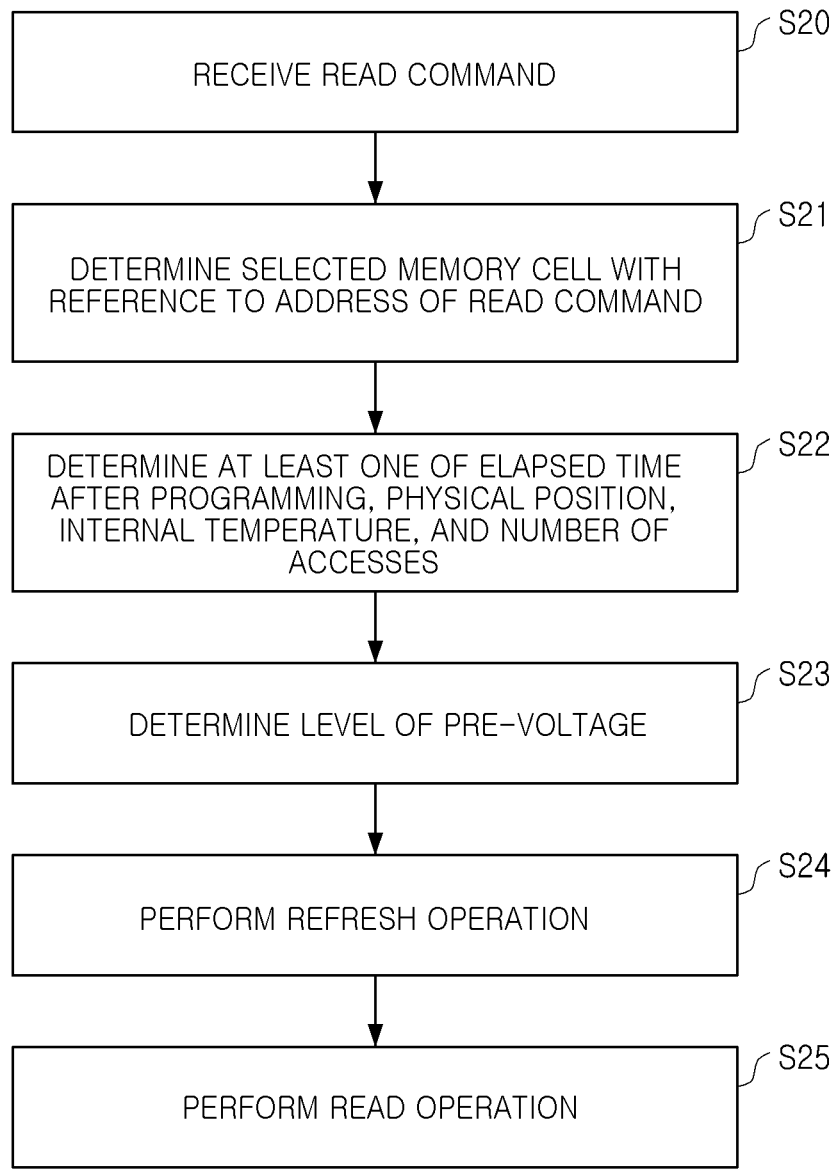
FIG. 14 is a flowchart illustrating an operation of a memory device according to an example embodiment of the present disclosure.

FIG. 14 is a flowchart illustrating an operation of a memory device according to an example embodiment.

Referring to FIG. 14, operations of the memory device in an example embodiment may be started with an operation in which the memory device receives a read command (S20).

The memory device may include a cell region and a peripheral circuit region, and may receive a read command from an external controller through an input/output interface included in the peripheral circuit region. The memory device may determine the selected memory cell with reference to an address included in the read command (S21).

The memory device may determine parameters for determining the level of the pre-voltage input to the selected memory cell in a refresh operation before the refresh operation is performed on the selected memory cell. For example, the memory device may determine an elapsed time after programming of a selected memory cell, a physical position according to an address of the selected memory cell, an internal temperature of the memory device, and the number of accesses to the selected memory cell (S22). The memory device may determine the level of the pre-voltage with reference to at least one of the parameters determined in operation S22 (S23) and may perform the refresh operation of applying the pre-voltage to the selected memory cell (S24). When the refresh operation is completed, the memory device may read data from the selected memory cell by performing a read operation on the selected memory cell (S25).

The determination in operation S22 may be performed based on a time point at which a read command for the selected memory cell is received. In other words, an elapsed time after the programming of the selected memory cell, a physical position according to an address of the selected memory cell, an internal temperature of the memory device, and the number of accesses to the selected memory cell may be determined based on the reception time of the read command. Accordingly, the memory device may determine the levels of the word line bias voltage and the bit line bias voltage for determining the level of the pre-voltage based on the reception time of the read command.

Figure 15A:
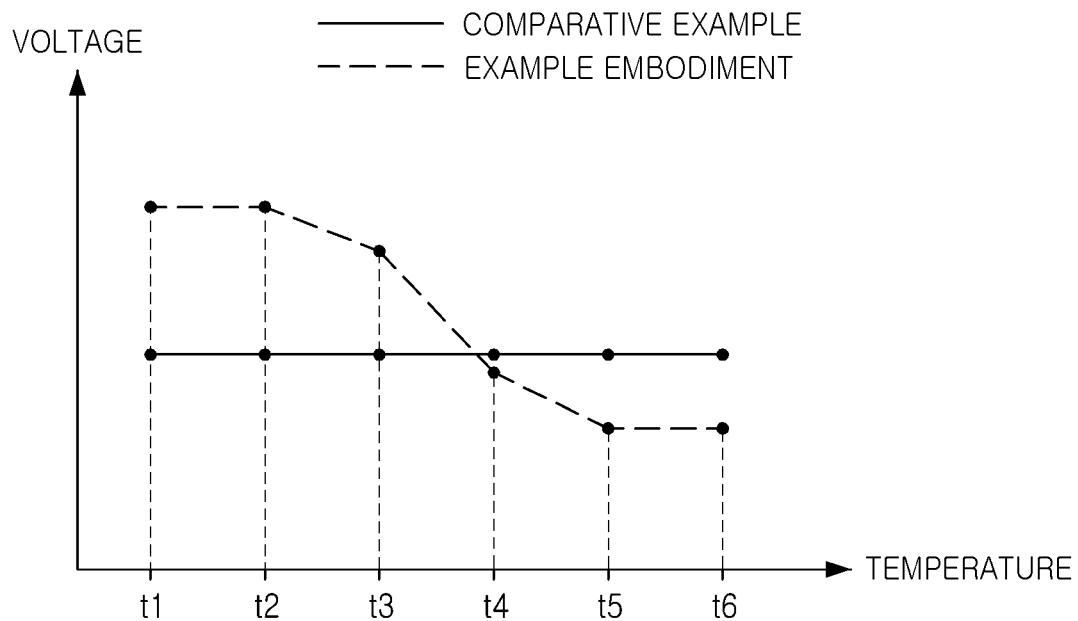
FIGS. 15A to 15C are diagrams illustrating operations of a memory device according to example embodiments of the present disclosure.
Figure 15B:
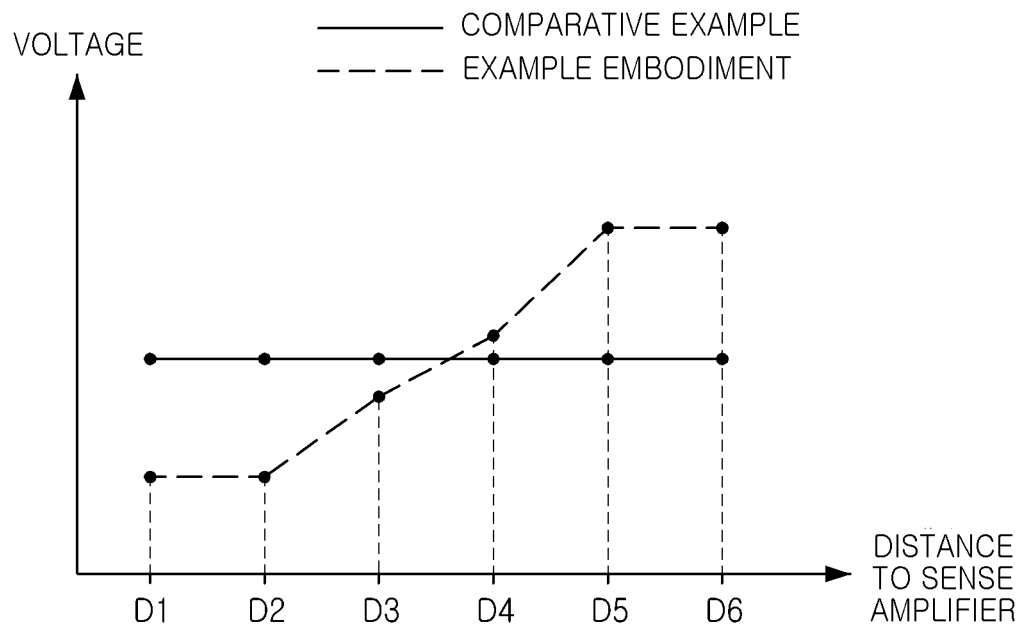
Figure 15C:
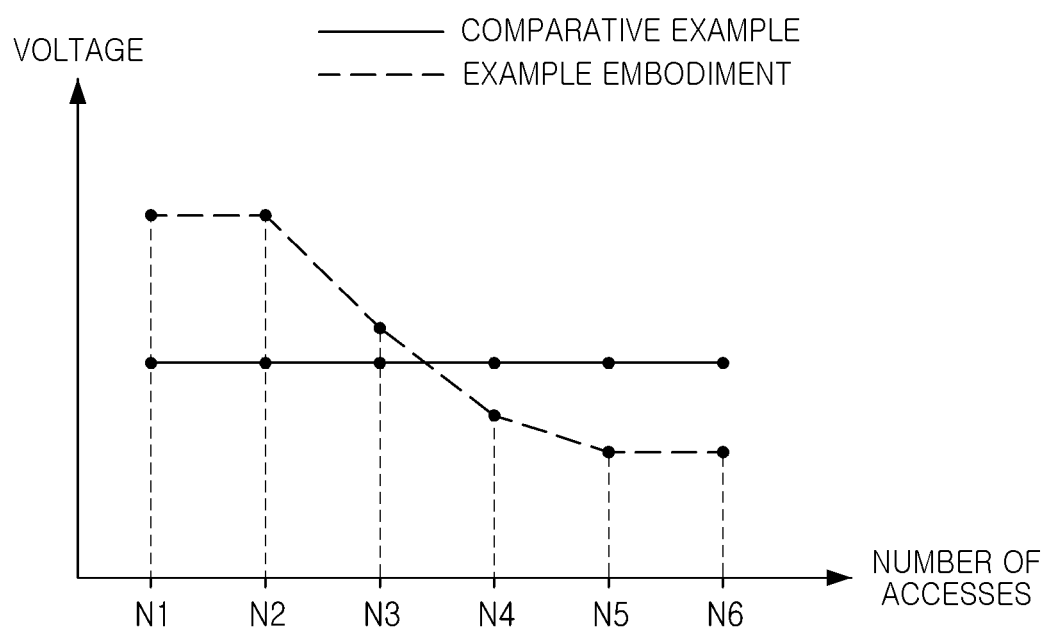

FIGS. 15A to 15C are diagrams illustrating operations of a memory device according to example embodiments.

In a graph illustrated in FIG. 15A, the horizontal axis may indicate an operating temperature of the memory device, and the vertical axis may indicate a level of the pre-voltage input to the selected memory cell in the refresh operation.

Referring to FIG. 15A, differently from the comparative example corresponding to the general method, in the example embodiment, the level of the pre-voltage input to the selected memory cell in the refresh operation may be varied according to the operating temperature. For example, as a first internal temperature t1 of the memory device increases to a sixth internal temperature t6, the level of the pre-voltage may decrease.

In the graph illustrated in FIG. 15B, the horizontal axis may indicate a distance from the selected memory cell to the sense amplifier, and the vertical axis may indicate a level of the pre-voltage input to the selected memory cell in the refresh operation. As described above, the distance from the selected memory cell to the sense amplifier may be varied depending on the selected word line and the selected bit line connected to the selected memory cell.

Referring to FIG. 15B, as a first distance D1 to the sense amplifier increases to a sixth distance D6, the level of the pre-voltage may increase. This is because, even when the same level of pre-voltage is input, the effect on the threshold voltage of the selected memory cell may be different depending on the physical position of the selected memory cell. For example, when a pre-voltage of the same level is input, the amount of change in threshold voltage of a selected memory cell adjacent to the sense amplifier may be greater than the amount of change in threshold voltage of a selected memory cell spaced apart from the sense amplifier. Accordingly, as illustrated in FIG. 15B, as the distance to the sense amplifier is short, the pre-voltage of a relatively low level may be input, such that accuracy of the read operation may increase and the increase in power consumption of the memory device may be reduced.

In the graph illustrated in FIG. 15C, the horizontal axis may indicate the number of accesses counted with reference to the selected memory cell, and the vertical axis may indicate a level of a pre-voltage input to the selected memory cell in a refresh operation. The number of accesses to the selected memory cell may be the number of times of use counted from the first use of the memory device or the number of times of use counted from a specific point in time. The number of accesses may be the counted number of program and/or read operations. Referring to FIG. 15C, as the number of accesses increases from a first number of times N1 to a sixth number of times N6, the level of the pre-voltage may decrease.

Figure 16:
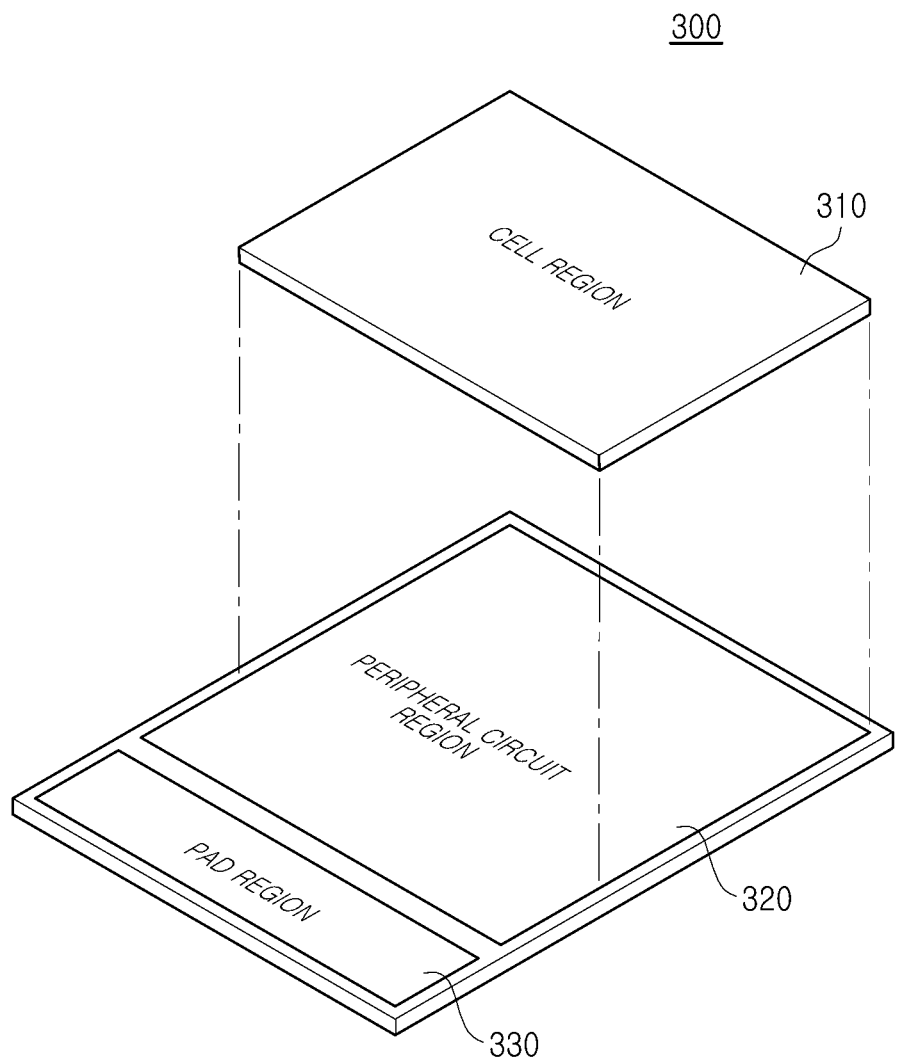
FIG. 16 is a diagram illustrating a structure of a memory device according to an example embodiment of the present disclosure.

FIG. 16 is a diagram illustrating a structure of a memory device according to an example embodiment.

Referring to FIG. 16, the memory device 300 in an example embodiment may include a cell region 310, a peripheral circuit region 320, and a pad region 330. Memory cells, and word lines and bit lines connected to the memory cells may be included in the cell region 310, and the cell region 320 may include a plurality of unit areas. The memory cells included in the cell region 310 may be disposed in a plurality of layers (e.g., vertical layers). For example, at least a portion of the memory cells disposed in different layers (e.g., different vertical layers) may share word lines or bit lines.

The pad region 330 may include a plurality of pads for inputting and outputting control commands and data, and the peripheral circuit region 320 may include a bit line decoder, a word line decoder, a read/write circuit, and a control logic. The control logic may determine a selected memory cell from among the memory cells, by controlling the bit line decoder and the word line decoder, and may perform a read operation for reading data of the selected memory cell and a program operation for writing data in the selected memory cell by controlling the read/write circuit.

Referring to FIG. 16, in the memory device 300 in an example embodiment, at least a portion of the peripheral circuit region 320 may be disposed below the cell region 310. For example, the word line decoder connected to word lines and the bit line decoder connected to bit lines, and the read/write circuit for reading or writing data may be disposed below the cell region 310. For example, in the cell region 310, memory cells, word lines, and bit lines may be connected to each other in a cross-point structure.

In an example embodiment, lower memory cells may be connected to lower word lines, and upper memory cells disposed above the lower memory cells may be connected to upper word lines. The lower word lines and the upper word lines may share a single sense amplifier included in the read/write circuit, or the lower word lines may be connected to a first sense amplifier and the upper word lines may be connected to a second sense amplifier. In example embodiments, the upper word lines and the lower word lines may share a single word line decoder or may be connected to different word line decoders.

As an example, the cell region 310 may include lower word lines, lower memory cells, bit lines, upper memory cells, and upper word lines, stacked in order on the peripheral circuit region 320. Since the other word lines, bit lines, and memory cells are not present between the lower word lines and the peripheral circuit region 320, the lower word lines may be connected to the peripheral circuit region 320 without particular limitation.

The bit lines may need to be connected to the peripheral circuit region 320 to avoid interference from the lower memory cells, and the upper word lines may need to be connected to the peripheral circuit region 320 to avoid interference from the memory cells, the bit lines, and the lower word lines. The upper memory cells connected to the upper word lines may be disposed to be relatively spaced apart from the sense amplifier as compared to the lower memory cells. Accordingly, in the refresh operation, when the selected memory cell is one of the upper memory cells, the level of the pre-voltage may be determined to be higher than when the selected memory cell is one of the lower memory cells.

Figure 17:
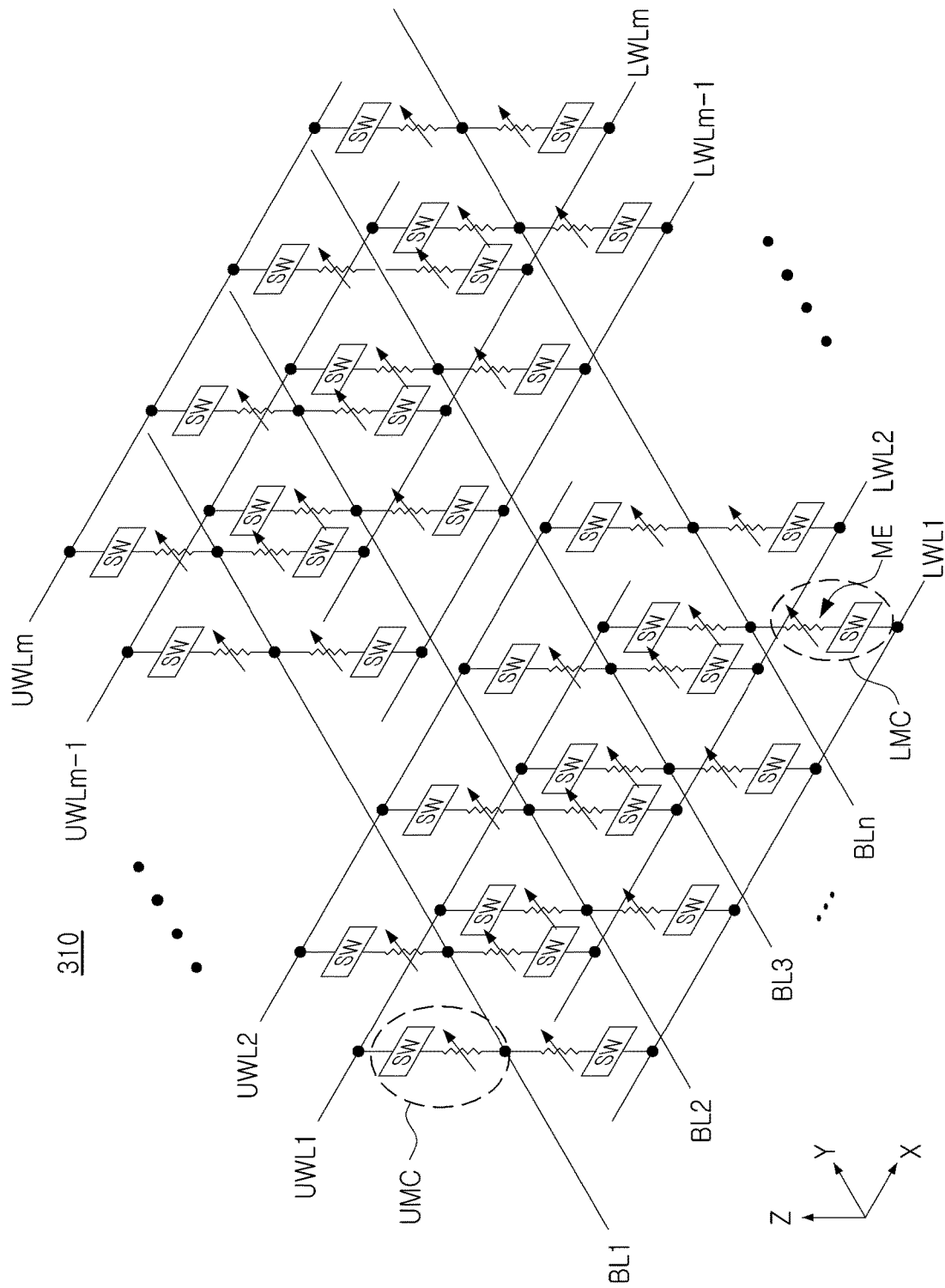
FIG. 17 is a diagram illustrating a memory cell array of a memory device according to an example embodiment of the present disclosure.

FIG. 17 is a diagram illustrating a memory cell array of a memory device according to an example embodiment.

Referring to FIG. 17, a cell region 310 may include bit lines BL1-BLn extending in a first direction (Y-axis direction) and word lines LWL1-LWLm and UWL1-UWLm extending in a second direction (X-axis direction). The first direction and the second direction may intersect each other, and may be, for example, perpendicular to each other.

Lower memory cells LMC may be disposed between the bit lines BL1-BLn and the lower word lines LWL1-LWLm, and upper memory cells UMC may be disposed between the bit lines BL1-BLn and the upper word lines UWL1-UWLm. The lower memory cells LMC and the upper memory cells UMC may have the same structure.

For example, each memory cell of the lower memory cells LMC and the upper memory cells UMC may include a switch element SW and a memory element ME. In an example embodiment, the switch element SW may be an ovonic threshold switch OTS. In an example embodiment, the memory element ME may be formed of a phase change material including a chalcogenide material and a superlattice. For example, the memory element ME may include a phase change material capable of a phase transition between an amorphous phase and a crystalline phase depending on a heating time and temperature.

In each memory cell of the memory cells LMC and UMC, the memory element ME and the switch element SW may be connected to each other in series. The order of connecting the memory element ME and the switch element SW is not limited to the example illustrated in FIG. 17 and may be varied. For example, the memory element ME and the switch element SW may be connected in sequence between the word lines LWL1-LWLm and UWL1-UWLm and the bit lines BL1-BLn.

In the example embodiment illustrated in FIG. 17, the bit lines BL1-BLn may be disposed between the lower memory cells LMC and the upper memory cells UMC in a third direction (Z-axis direction), and may be shared by the lower memory cells LMC and the upper memory cells UMC. However, an example embodiment thereof is not limited thereto, and the structure of the cell region 310 may be varied. For example, word lines may be disposed between the lower memory cells LMC and the upper memory cells UMC such that the lower memory cells LMC and the upper memory cells UMC may share word lines. In this case, the lower memory cells LMC may be connected to lower bit lines and the upper memory cells UMC may be connected to upper bit lines.

Figure 18:
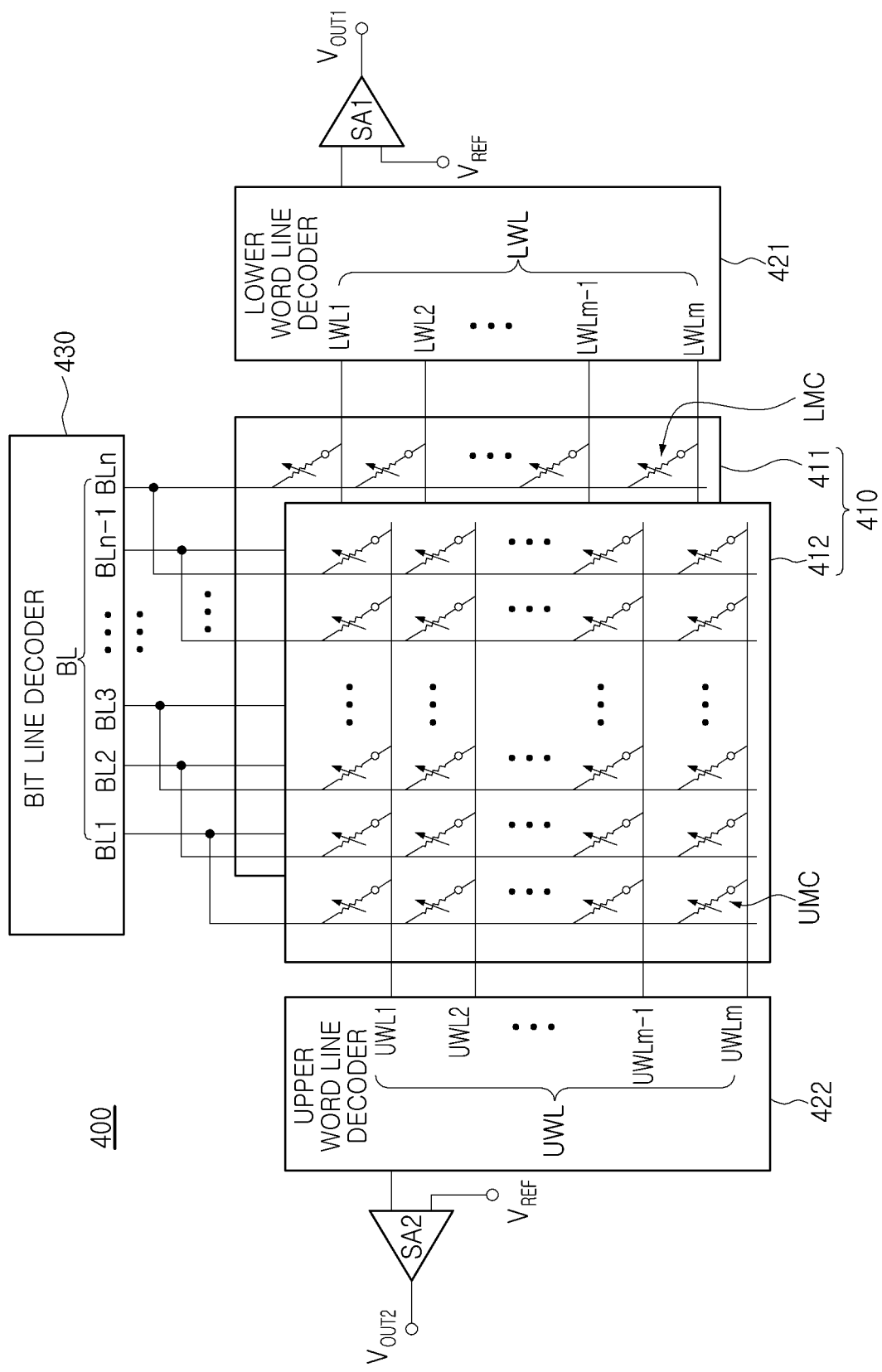
FIGS. 18 and 19 are block diagrams illustrating a memory device according to an example embodiment of the present disclosure.
Figure 19:
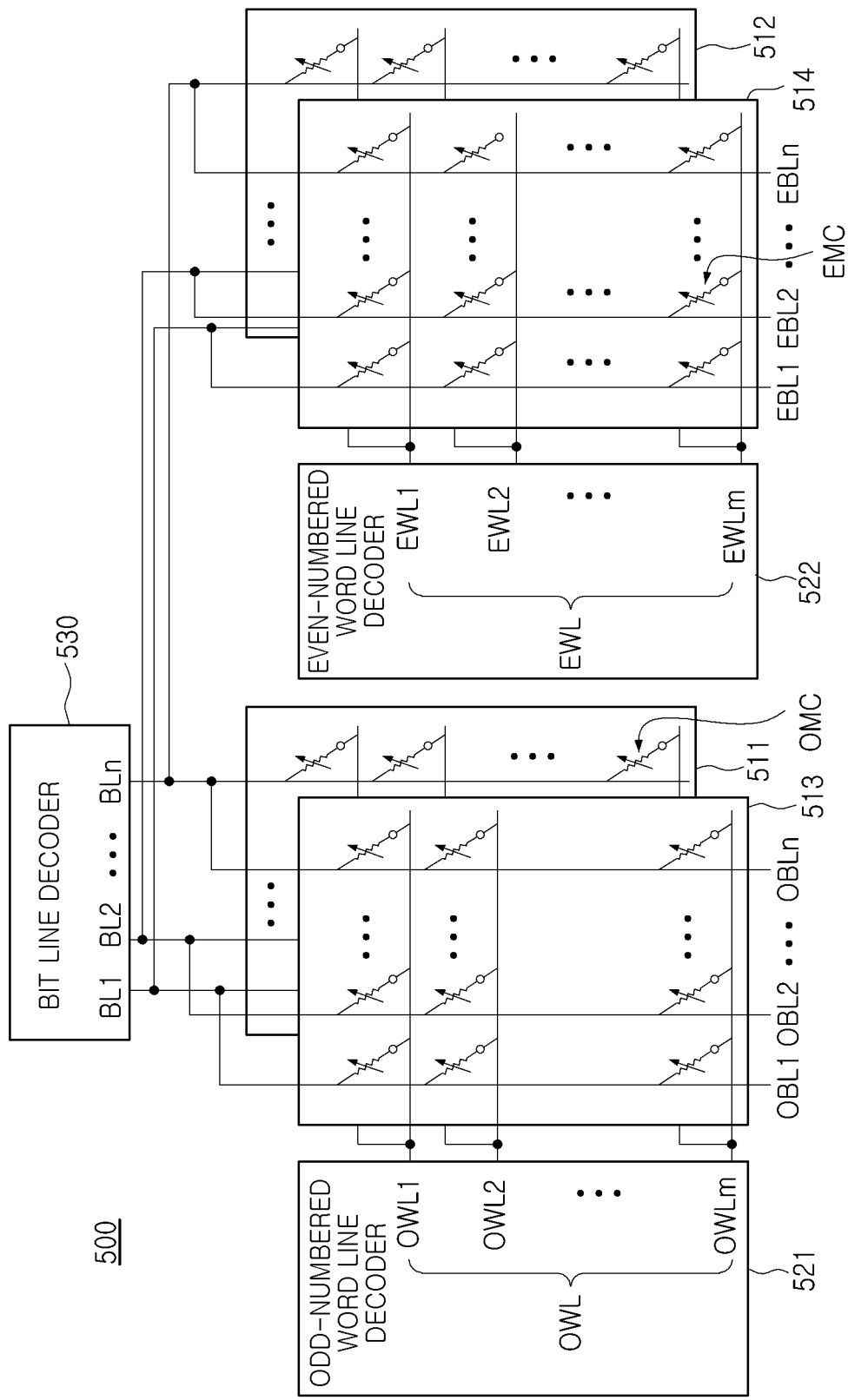

FIGS. 18 and 19 are block diagrams illustrating a memory device according to an example embodiment.

Referring to FIG. 18, a cell region 410 of a memory device 400 in an example embodiment may include a plurality of cell layers. For example, the plurality of cell layers may include a first cell layer 411 and a second cell layer 412. Lower memory cells LMC included in the first cell layer 411 may be connected to lower word lines LWL, and upper memory cells UMC included in the second cell layer 412 may be connected to upper word lines UWL.

As described above with reference to FIG. 17, the upper memory cells UMC and the lower memory cells LMC may share bit lines BL. For example, the upper memory cells UMC may be connected to an upper portion of each of the bit lines BL, and the lower memory cells LMC may be connected to a lower portion of each of the bit lines BL. Although the bit lines BL are shared, the upper memory cells UMC and the lower memory cells LMC may be independently controlled. For example, when the bit line decoder 430 selects the first bit line BL1 and the upper word line decoder 422 selects the first upper word line UWL1, the lower word line decoder 421 may not select the first lower word line LWL1. Accordingly, the upper memory cell UMC connected between the first bit line BL1 and the first upper word line UWL1 may be controlled.

In the example embodiment illustrated in FIG. 18, the number of upper word lines UWL may be the same as the number of lower word lines LWL, but an example embodiment thereof is not limited thereto. For example, the number of upper word lines UWL may be greater than the number of lower word lines LWL, and accordingly, the number of upper memory cells UMC may be greater than the number of lower memory cells LMC.

Referring to FIG. 19, a cell region 510 of the memory device 500 in an example embodiment may include a plurality of cell layers. The plurality of cell layers may include a first cell layer 511, a second cell layer 512, a third cell layer 513, and a fourth cell layer 514 stacked in order. In an example embodiment, the odd-numbered memory cells OMC included in the first cell layer 511 and the third cell layer 513 may be connected to the odd-numbered word line decoder 521 through the odd-numbered word lines OWL. The even-numbered memory cells EMC included in the second cell layer 512 and the fourth cell layer 514 may be connected to the even-numbered word line decoder 522 through the even-numbered word lines EWL. However, in example embodiments, the cell layers 511-514 may be connected to different word line decoders one by one.

In the example embodiment illustrated in FIG. 19, the bit lines BL may be shared by the odd-numbered memory cells OMC and the even-numbered memory cells EMC. For example, the bit lines BL may include lower bit lines disposed between the first cell layer 511 and the second cell layer 512, and upper bit lines disposed between the third cell layer 513 and the fourth cell layer 514. For example, the lower bit line and the upper bit line disposed in the same position on a plane perpendicular to the stacking direction of the cell layers 511-514 may be electrically connected to each other. Accordingly, when the bit line decoder 530 selects one of the bit lines BL, the lower bit line and the upper bit line may be simultaneously selected. However, in example embodiments, the lower bit lines and the upper bit lines may be electrically separated from each other and may be individually selected by different bit line decoders.

In the memory device having the structure described with reference to FIGS. 18 and 19, the number of sense amplifiers may be varied. For example, referring to FIG. 18, a first sense amplifier SA1 may be connected to the lower word line decoder 421, and a second sense amplifier SA2 may be connected to the upper word line decoder 422. However, an example embodiment thereof is not limited thereto, and the lower word line decoder 421 and the upper word line decoder 422 may share a single sense amplifier. In the example embodiment illustrated in FIG. 19, the first sense amplifier SA1 may be connected to the odd-numbered word line decoder 521 and the second sense amplifier SA2 may be connected to the even-numbered word line decoder 522, or the odd-numbered word line decoder 521 and the even-numbered word line decoder 522 may be connected to a single sense amplifier in common.

As described above with reference to FIG. 16, the word line decoder may be disposed below the cell region as a peripheral circuit region. Accordingly, the memory cells disposed relatively above may be disposed to be spaced apart from the sense amplifier. In an example embodiment, the level of the pre-voltage input to the selected memory cell may be determined differently in consideration of the structural aspects.

In the example embodiment illustrated in FIG. 18, when the selected memory cell is disposed in the first cell layer 411, the distance between the first sense amplifier SA1 and the selected memory cell may be shorter than the distance between the second sense amplifier SA2 and the selected memory cell when the selected memory cell is disposed on the second cell layer 412. Accordingly, when the selected memory cell is disposed in the first cell layer 411, the level of the pre-voltage may be determined to be lower than the level of the pre-voltage when the selected memory cell is disposed on the second cell layer 412.

Similarly, in the example embodiment illustrated in FIG. 19, when the selected memory cell is disposed in the first cell layer 511, the level of the pre-voltage may be determined to be lower than the level of the pre-voltage of when the selected memory cell is disposed on the third cell layer 513. However, alternatively, the level of the pre-voltage may be determined in consideration of the position in which the selected memory cell is included among the cell layers 511-514 and also the distance from the input terminal of the sense amplifier to the selected memory cell. In this case, the level of the pre-voltage of when the selected memory cell is disposed in the second cell layer 512 may be lower than the level of the pre-voltage of when the selected memory cell is disposed on the first cell layer 511.

Figure 20A:
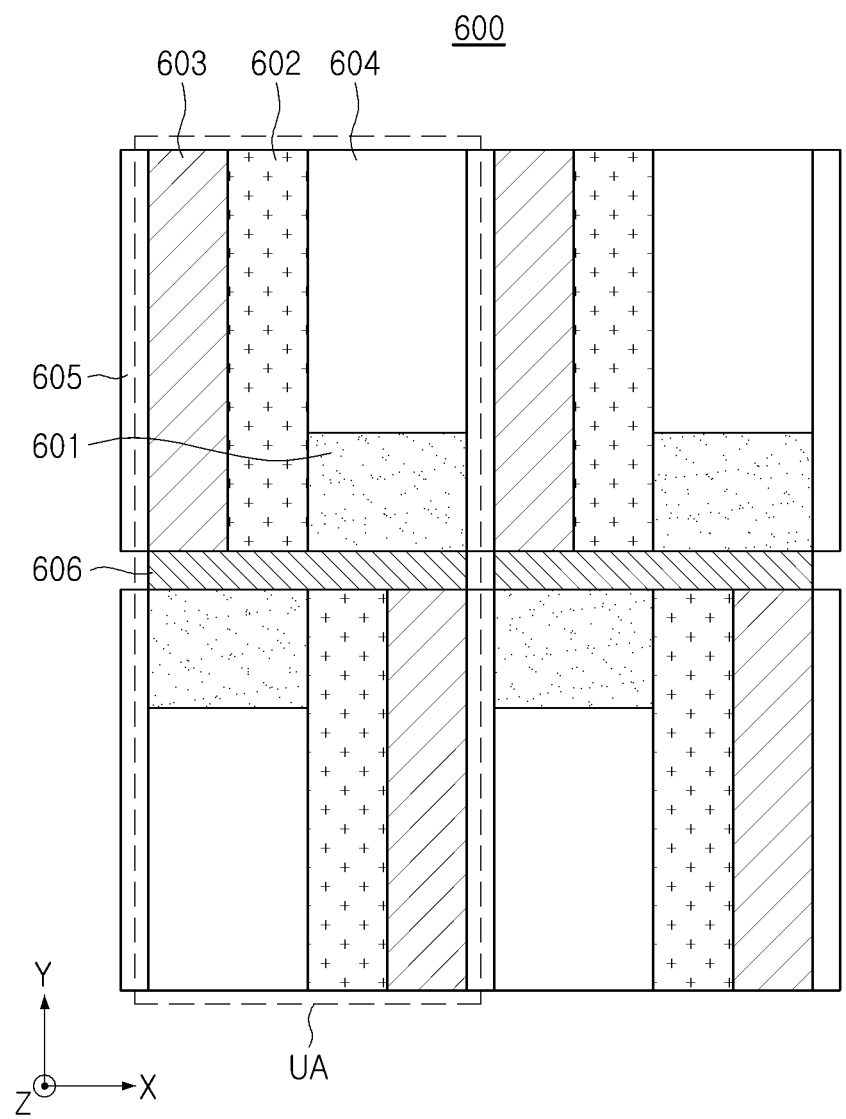
FIGS. 20A and 20B are diagrams illustrating a structure of a memory device according to an example embodiment of the present disclosure.
Figure 20B:
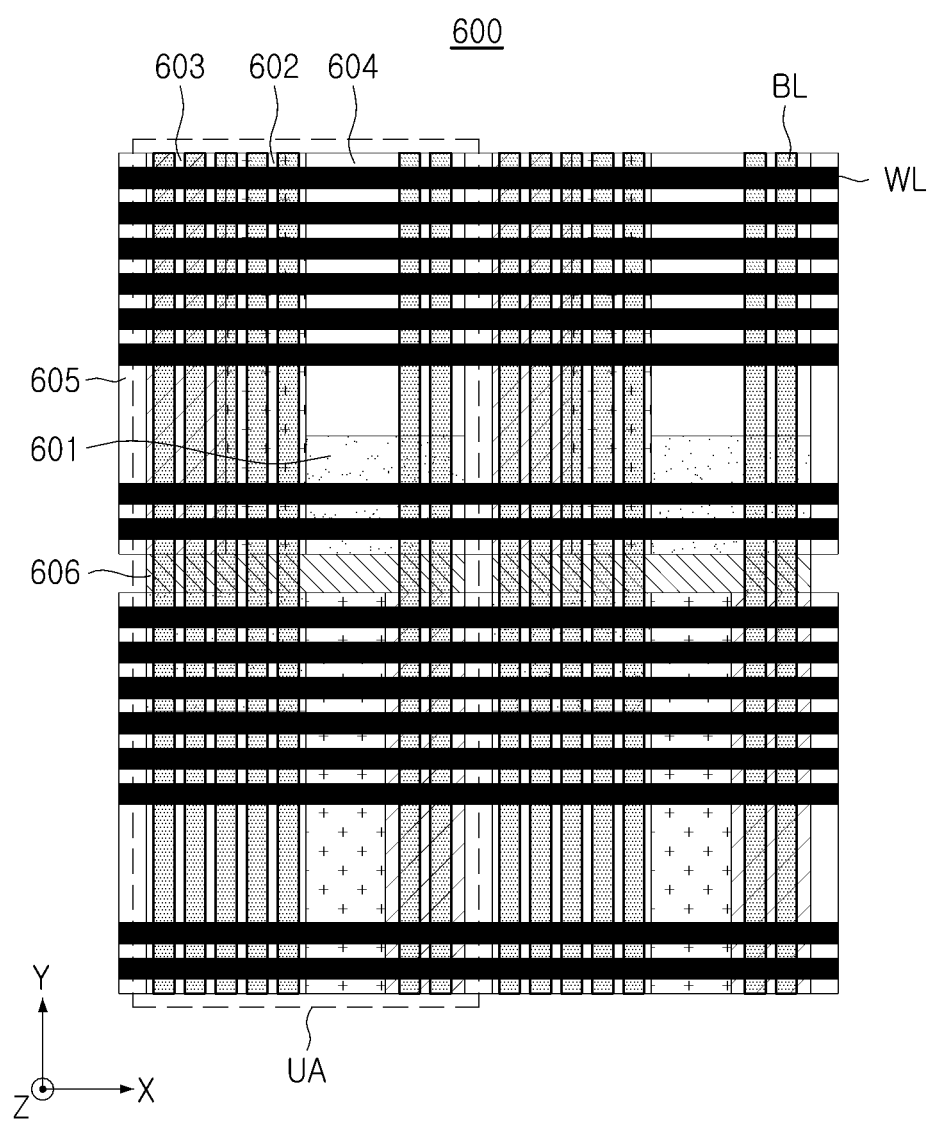

FIGS. 20A and 20B are diagrams illustrating a structure of a memory device according to an example embodiment.

FIG. 20A may be a plan diagram illustrating a portion of a peripheral circuit region disposed below memory cells in a memory device 600. Referring to FIG. 20A, the peripheral circuit region may be divided into unit areas UA. The unit areas UA may be arranged in a first direction (Y-axis direction) and a second direction (X-axis direction). As illustrated in FIG. 20B, a cell region including memory cells, bit lines BL, and word lines WL may be disposed above the peripheral circuit region in a third direction (Z-axis direction). Hereinafter, it may be assumed that the cell region may include the bit lines BL, the lower word lines disposed between the bit lines BL and the peripheral circuit region in the third direction, and the upper word lines disposed above the bit lines.

The peripheral circuit region may include a bit line decoder region 601, a lower word line decoder region 602, un upper word line decoder region 603, a circuit region 604, a word line contact region 605, and a bit line contact region 606. The word line contact region 605 may be disposed between unit areas UA, and each of the unit areas UA may include a first unit area and a second unit area separated from each other in the first direction by the bit line contact region 606.

A bit line decoder connected to bit lines through bit line contacts may be disposed in the bit line decoder region 601. In an example embodiment, the bit lines may be disposed above the peripheral circuit region in the third direction and may extend in the first direction. As described above with reference to FIG. 10, the bit line decoder may include switch elements connected to the bit lines BL, and at least one of the bit lines may be selected according to turning on/off of the switch elements.

Bit line contacts connected to the bit lines BL may be disposed in the bit line contact region 606. Also, circuit wirings connected to the elements disposed in the bit line decoder region 601 may extend between the bit line decoder region 601 and the bit line contact region 606.

The lower word line decoder disposed in the lower word line decoder region 602 may be connected to the lower word lines through the lower word line contacts, and the upper word line decoder disposed in the upper word line decoder region 603 may be connected to the upper word lines through the upper word line contacts different from the lower word line contacts.

The word lines WL including the lower word lines and the upper word lines may extend in the second direction. The lower word line decoder and the upper word line decoder may include switch elements connected to the word line contacts, and at least one of the lower word lines and the upper word lines may be selected according to turning on/off of the switch elements.

Assuming that the lower word lines may share a single first sense amplifier and the upper word lines may share a single second sense amplifier, the first sense amplifier and the second sense amplifier may be disposed on the lower word line decoder region 602 and the upper word line decoder region 603, respectively, or may be disposed in the circuit region 604. In the structure illustrated in FIG. 20A, the length of the lower word line contacts for connecting the lower word lines to the lower word line decoder may be shorter than the length of the upper word line contacts for connecting the upper word lines to the upper word line decoder. That is because, differently from the upper word line contacts disposed in the word line contact region 605 and bypassing the bit lines BL, the lower word line contacts may be directly connected to the lower word lines above the lower word line decoder region 602.

Accordingly, the distance between the input terminal of the first sense amplifier and the lower word lines may be shorter than the distance between the input terminal of the second sense amplifier and the upper word lines. Accordingly, a greater resistance may act in the refresh operation performed when one of the upper memory cells is the selected memory cell than in the refresh operation performed when one of the lower memory cells is the selected memory cell. Accordingly, when one of the upper memory cells is the selected memory cell, the level of the pre-voltage for the refresh operation may be determined to be higher.

Figure 21:
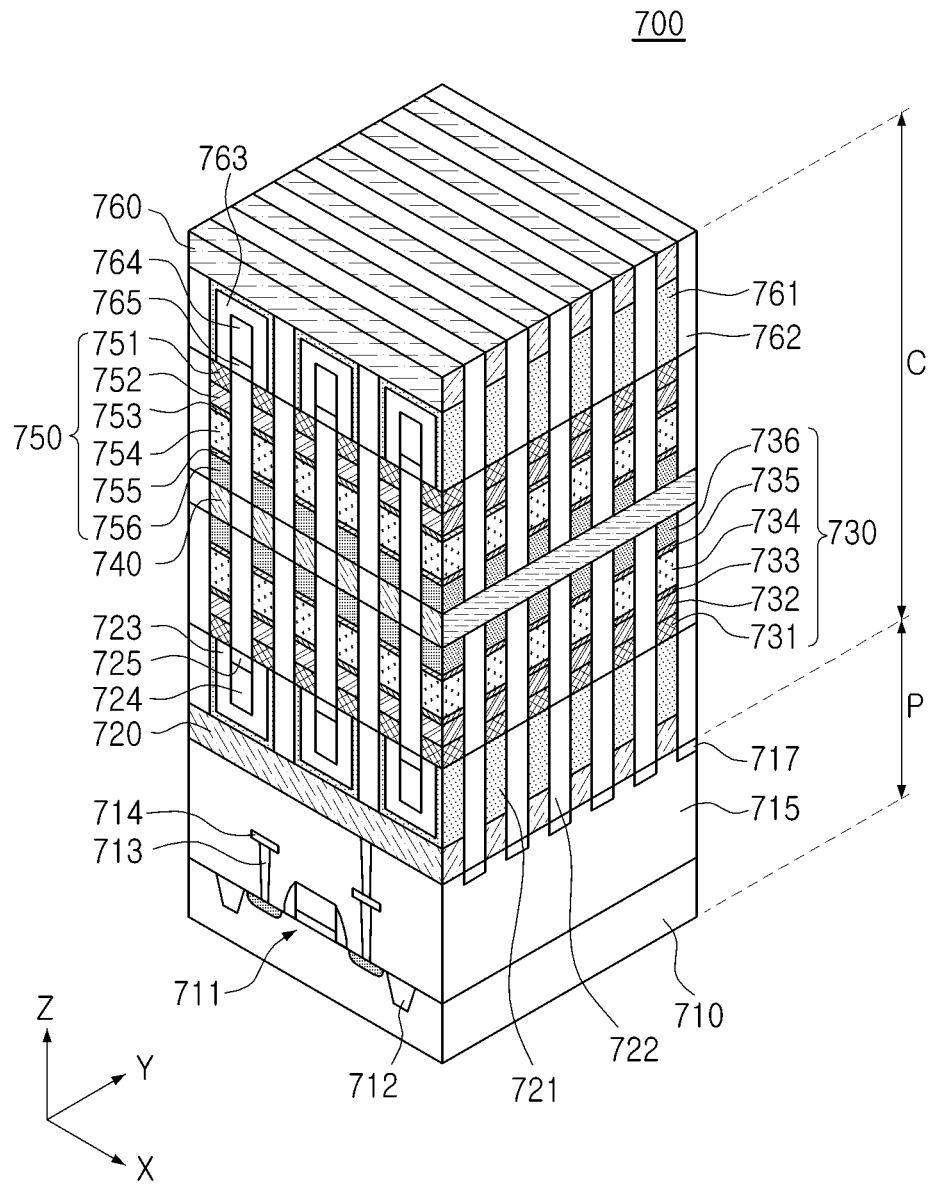
FIG. 21 is a diagram illustrating a memory device according to an example embodiment of the present disclosure.

FIG. 21 is a diagram illustrating a memory device according to an example embodiment.

Referring to FIG. 21, a memory device 700 may include a peripheral circuit region P including a plurality of circuit elements 711 formed on a semiconductor substrate 710, and a cell region C including a plurality of memory cells 730 and 750. The cell region C may include a plurality of bit lines 740 extending in the first direction (Y-axis direction) and a plurality of word lines 720 and 760 extending in the second direction (X-axis direction).

For example, the cell region C may include the lower word lines 720 disposed below the bit lines 740 in the third direction (Z-axis direction) and the upper word lines 760 disposed above the bit lines 740. The lower memory cells 730 may be disposed between the bit lines 740 and the lower word lines 720, and the upper memory cells 750 may be disposed between the bit lines 740 and the upper word lines 760.

The circuit elements 711 may be adjacent to a device isolation film 712 in at least one of the first direction and the second direction, and may be connected to circuit wirings 714 through a device contact 713. The circuit elements 711 may be covered by an interlayer insulating layer 715. For example, the circuit elements 711 illustrated in FIG. 21 may provide a lower word line decoder connected to the lower word lines 720.

The lower word lines 720 may be connected to a heating electrode layer 721. In the example embodiment illustrated in FIG. 5, the heating electrode layer 721 may be connected to a pair of lower memory cells 730 adjacent in the second direction, but an example embodiment thereof is not limited thereto. For example, each of the lower memory cells 730 may be connected to a single heating electrode layer 721. In the process of forming the heating electrode layer 721 and the lower word lines 720, a recess 717 may be formed.

The heating electrode layer 721 may be separated from each other by a lower insulating pattern 722. An insulating spacer 723 and internal insulating layers 724 and 725 may be disposed in the heating electrode layer 721. The lower insulating pattern 722, the insulating spacer 723, and the internal insulating layers 724 and 725 may be formed of silicon oxide or silicon nitride.

Each of the lower memory cells 730 may include a variable resistor layer 731 in contact with the heating electrode layer 721, a first electrode layer 732 and a selection element layer 734 stacked in order on the variable resistor layer 731, and a second electrode layer 736. In example embodiments, a first interface layer 733 and a second interface layer 733 and a second interface layer 733 may be disposed between the selection element layer 734 and the first electrode layer 732, and between the selection element layer 734 and the second electrode layer 736.

The variable resistor layer 731 may be formed of a material which may cause a phase change by heat transferred from the heating electrode layer 721. For example, the variable resistor layer 731 may include Ge—Sb—Te (GST), which is a chalcogenide material. Alternatively, the variable resistor layer 731 may be formed of a chalcogenide material including at least two elements selected from among S1, Ge, Sb, Te, Bi, In, Sn, and Se.

The selection element layer 734 may include a material of which resistance changes according to the magnitude of the voltage applied to both ends thereof, and may include, for example, an ovonic threshold switching (OTS) material. The OTS material may include a chalcogenide switching material. In an example embodiment, the selection element layer 734 may include Si, Te, As, Ge, and In, or a combination of these elements, or may further include nitrogen. The material of the selection element layer 734 is not limited to the above example, and may include various materials for selecting an element.

Upper memory cells 750, a heating electrode layer 761, and upper word lines 760 may be disposed on the bit lines 740. Referring to FIG. 21, the heating electrode layer 761 may be connected to the upper word lines 760, and the heating electrode layer 761 may be separated from each other by an upper insulating pattern 762. An insulating spacer 763 and internal insulating layers 764 and 765 may be disposed in the heating electrode layer 761.

The upper memory cells 750 may have the same structure as that of the lower memory cells 730. For example, each of the upper memory cells 750 may include a variable resistor layer 751 in contact with the heating electrode layer 761, a first electrode layer 752 and a selection element layer 754 disposed in order below the variable resistor layer 751, and a second electrode layer 756. Similarly to the lower memory cells 730, the first interface layer 753 and the second interface layer 755 may be disposed between the selection element layer 754 and the first electrode layer 752 and between the selection element layer 754 and the second electrode layer 756.

Figure 22:
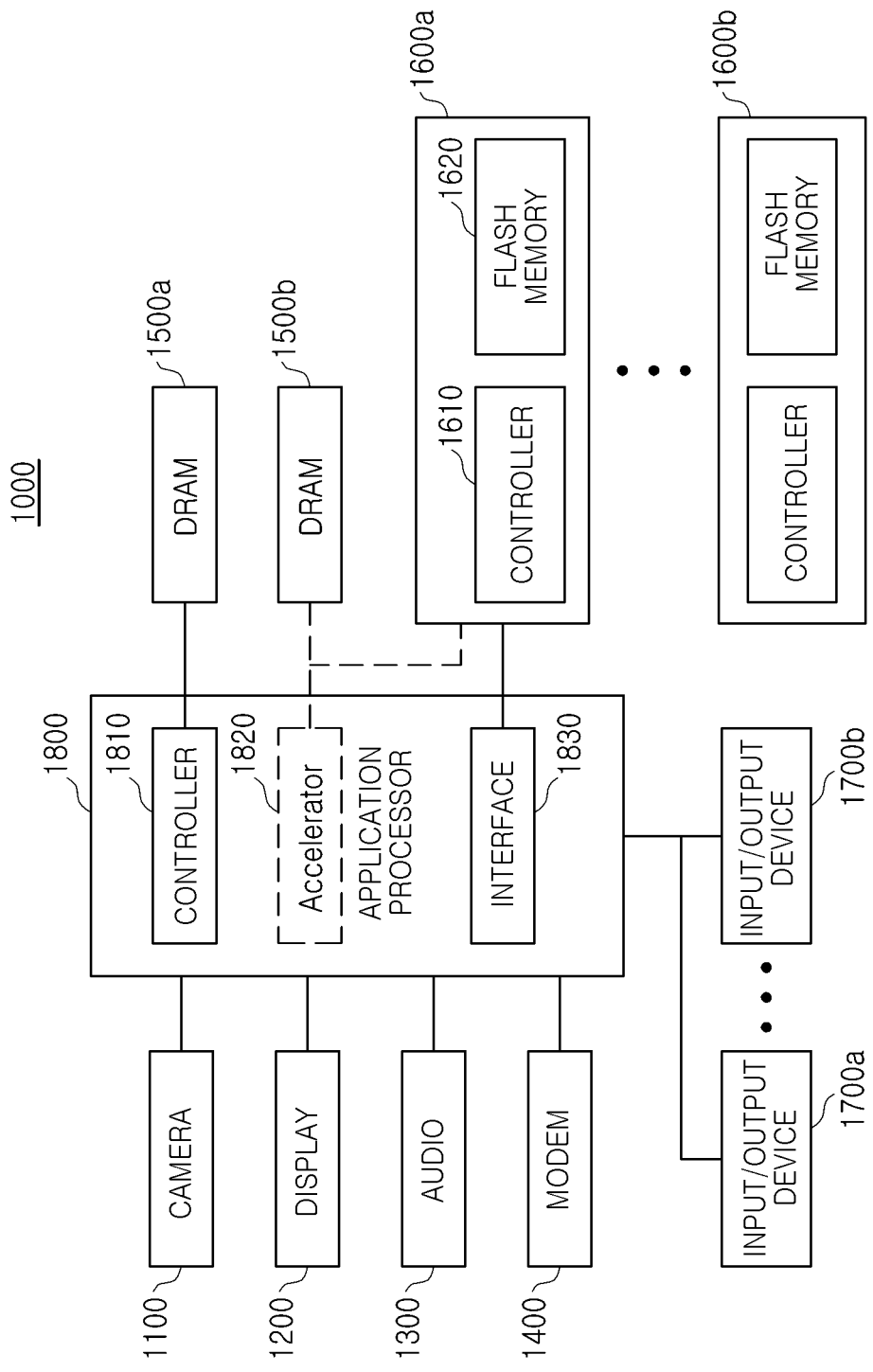
FIG. 22 is a block diagram illustrating a system including a memory device according to an example embodiment of the present disclosure.

FIG. 22 is a block diagram illustrating a system including a memory device according to an example embodiment.

Referring to FIG. 22, a system 1000 may include a camera 1100, a display 1200, an audio processing unit 1300, a modem 1400, dynamic random access memories (DRAMs) 1500*a* and 1500*b*, flash memory devices 1600*a* and 1600*b*, input/output devices 1700*a* and 1700*b*, and an application processor 1800 (hereinafter, "AP"). In an example embodiment, the system 1000 may be provided as a laptop computer, a portable terminal, a smartphone, a tablet PC, a wearable device, a healthcare device, or an internet-of-things (IoT) device, or as a server or a personal computer.

The camera 1100 may take a still image or a video according to user's control. The system 1000 may obtain information using a still image/video captured by the camera 1100, or may convert the still image/video into other types of data such as text and may store the data. Alternatively, the system 1000 may recognize a character string included in the still image/video captured by the camera 1100 and may a text or audio translation corresponding to the character string.

The display 1200 may be implemented in various forms, such as a liquid crystal display (LCD), an organic light emitting diodes (OLED) display, an Active-Matrix Organic Light-Emitting Diode (AM-OLED), a plasma display panel (PDP), a field emission display (FED), an electronic paper, or the like. In an example embodiment, the display 1200 may provide a touch screen function and may also be used as an input device of the system 1000. Also, the display 1200 may be integrated with a fingerprint sensor and may provide a security function of the mobile system 1000.

The audio processing unit 1300 may process audio data stored in the flash memory devices 1600*a* and 1600*b* or audio data included in the content received from an external entity through the modem 1400 or the input/output devices 1700*a* and 1700*b*. For example, the audio processing unit 1300 may perform various processes such as coding/decoding, amplification, and noise filtering on audio data.

The modem 1400 may modulate a signal for transmission and reception of wired/wireless data and may transmit the signal, and may also demodulate a signal received from an external entity and may restore the original signal. The input/output devices 1700*a* and 1700*b* may be configured to provide digital input/output, and may include a port connected to an external recording medium, an input device such as a touch screen or a mechanical button key, an output device for outputting vibrations in a haptic manner. In example embodiments, the input/output devices 1700*a* and 1700*b* may be connected to an external recording medium through a port such as a USB, a lightning cable, an SD card, a micro SD card, a DVD, a network adapter, or the like.

The AP 1800 may control overall operation of the system 1000. Specifically, the AP 1800 may control the display 1200 to display a portion of the content stored in the flash memory devices 1600*a* and 1600*b* on the screen. Also, when a user input is received through the input/output devices 1700*a* and 1700*b*, the AP 1800 may perform a control operation corresponding to the user input.

The AP 1800 may be provided as a system-on-chip (SoC) for driving an application program, an operating system (OS), and the like. Also, the AP 1800 may be included in a single semiconductor package along with other devices included in the mobile system 1000, such as, for example, the DRAM 1500*a*, the flash memory 1620, and/or the memory controller 1610.

In an example embodiment, the AP 1800 may include an accelerator block 1820 which may be a dedicated circuit for AI data operation. Alternatively, in example embodiments, a separate accelerator chip may be provided separately from the AP 1800, and a DRAM 1500*b* may be additionally connected to the accelerator block 1820 or the accelerator chip. The accelerator block 1820 may be a function block which may perform a specific function of the AP 1800, and may include a Graphics Processing Unit (GPU) which may be a function block performing graphic data processing, a Neural Processing Unit (NPU) which may be a block performing AI calculation and inference, a Data Processing Unit (DPU) which may be a block performing data transmission.

According to an example embodiment, the system 1000 may include the plurality of DRAMs 1500*a* and 1500*b*. In an example embodiment, the AP 1800 may include a controller 1810 for controlling the DRAMs 1500*a* and 1500*b*, and the DRAM 1500*a* may be directly connected to the AP 1800. Although only the DRAMs 1500*a* and 1500*b* are illustrated in FIG. 22, the configuration of the system 1000 is not necessarily limited to the example, and other memories other than the DRAMs 1500*a* and 1500*b* may be included in the system 1000 depending on a bandwidth, a reaction speed, and voltage conditions of the AP 1800 or the accelerator block 1820. For example, the controller 1810 and/or the accelerator block 1820 may control various memories such as PRAM, static RAM (SRAM), MRAM, resistive RAM (RRAM), ferroelectric RAM (FRAM), and Hybrid RAM. Alternatively, at least a portion of the DRAMs 1500*a* and 1500*b* may be replaced with PRAM, MRAM, or RRAM. For example, the various memories may include one of the memory devices 10, 100, 200, 300, 400, 500, 600, and 700 disclosed above in FIGS. 1, 4, 10, 16, 18, 19, 20A, and 21, respectively.

The system 1000 may include a plurality of storages or a plurality of flash memory devices 1600*a* and 1600*b* having a capacity larger than those of the DRAMs 1500*a* and 1500*b*. The flash memory devices 1600*a* and 1600*b* may include a controller 1610 and a flash memory 1620. The controller 1610 may receive a control command and data from the AP 1800, and may write data in the flash memory 1620 or may read data stored in the flash memory 1620 and may transmit the data to the AP 1800 in response to the control command. At least a portion of the flash memory devices 1600*a* and 1600*b* may also be replaced with PRAM, MRAM, and RRAM in example embodiments.

According to the aforementioned example embodiments, a level of the voltage input to the selected memory cell may be determined in an initialization operation before the read operation based on at least one of various parameters affecting the threshold voltage distribution of the selected memory cell. Accordingly, the threshold voltage distribution may improve such that reliability and performance of the memory device may improve.

While the example embodiments have been illustrated and described above, it will be apparent to those skilled in the art that modifications and variations could be made without departing from the scope of the present disclosure as defined by the appended claims.

What is claimed is:

1. A memory device, comprising:
a cell region including a plurality of word lines, a plurality of bit lines, and a plurality of memory cells connected to the plurality of word lines and the plurality of bit lines, wherein each of the plurality of memory cells includes a switch element and a memory element connected to each other in series between a corresponding word line and a corresponding bit line; and
a peripheral circuit region including a control logic configured to, when a read command for a selected memory cell among the plurality of memory cells is received from an external controller, input a pre-voltage to the selected memory cell before reading data of the selected memory cell,
wherein the control logic is configured to determine:
an elapsed time after programming of the selected memory cell using a time point at which the read command is received and a time point at which a last write operation is performed on the selected memory cell, and
a level of the pre-voltage with reference to the elapsed time after programming of the selected memory cell, and
wherein the level of the pre-voltage is variable based on the elapsed time after programming of the selected memory cell.

2. The memory device of claim 1, wherein the control logic is configured to increase a level of the pre-voltage as the elapsed time after the programming increases.

3. The memory device of claim 1, wherein the elapsed time after the programming is a time between a time point at which the memory device receives a write command for writing data in the selected memory cell and a time point at which the memory device receives the read command.

4. The memory device of claim 1, wherein the control logic is configured to:
input the pre-voltage to the selected memory cell,
after a predetermined delay time elapses from inputting the pre-voltage, input a read voltage to the selected memory cell, and
read data from the selected memory cell based on the read voltage.

5. The memory device of claim 4, wherein a level of the pre-voltage is equal to or greater than a level of the read voltage.

6. The memory device of claim 4, wherein a time period for which the pre-voltage is input to the selected memory cell is shorter than a time period for which the read voltage is input to the selected memory cell.

7. The memory device of claim 1,
wherein each of the memory cells has a first state having a threshold voltage within a first range or a second state having a threshold voltage within a second range greater than the threshold voltage of the first range, based on a resistance of the memory element, and
wherein a level of the pre-voltage is equal to or greater than the maximum threshold voltage of the first range.

8. The memory device of claim 1, wherein the control logic is configured to determine a level of the pre-voltage to be lower as an operating temperature of the memory device increases.

9. The memory device of claim 1,
wherein the peripheral circuit region includes at least one sense amplifier connected to the plurality of memory cells through the plurality of word lines, and
wherein the control logic is configured to decrease a level of the pre-voltage as a distance from an input terminal of the sense amplifier to the selected memory cell increases.

10. The memory device of claim 1, wherein the control logic is configured to decrease a level of the pre-voltage as the number of times of using the selected memory cell increases.

11. A memory device, comprising:
a cell region including a plurality of memory cells connected to a plurality of word lines and a plurality of bit lines;
a word line decoder connected to the plurality of word lines and configured to input a word line bias voltage to a selected word line among the plurality of word lines;
a bit line decoder connected to the plurality of bit lines and configured to input a bit line bias voltage to a selected bit line among the plurality of bit lines; and
a control logic configured to:
control the word line decoder and the bit line decoder,
perform a read operation by inputting the word line bias voltage and the bit line bias voltage to a selected memory cell connected to the selected word line and the selected bit line, and
perform a refresh operation by inputting a pre-voltage to the selected memory cell prior to the read operation of the selected memory cell,
wherein the control logic is configured to determine a level of the pre-voltage based on at least one of a physical position of the selected memory cell, the number of accesses to the selected memory cell, and an operating temperature of the memory device.

12. The memory device of claim 11, further comprising:
a read/write circuit including a sense amplifier connected to the plurality of word lines through the word line decoder,
wherein the physical position of the selected memory cell corresponds to a length of the selected word line between the selected memory cell and an input terminal of the sense amplifier.

13. The memory device of claim 12, wherein the memory device is configured such that the sense amplifier is deactivated during the refresh operation.

14. The memory device of claim 11, wherein the word line bias voltage is a negative voltage, and the bit line bias voltage is a positive voltage.

15. The memory device of claim 14,
wherein a level of the word line bias voltage in the refresh operation is equal to a level of the word line bias voltage in the read operation, and
wherein a level of the bit line bias voltage in the refresh operation is greater than a level of the bit line bias voltage in the read operation.

16. The memory device of claim 14,
wherein a level of the word line bias voltage in the refresh operation is greater than a level of the word line bias voltage in the read operation, and wherein a level of the bit line bias voltage in the refresh operation is equal to a level of the bit line bias voltage in the read operation.

17. The memory device of claim 14,
wherein a level of the word line bias voltage in the refresh operation is different from a level of the word line bias voltage in the read operation, and
wherein a level of the bit line bias voltage in the refresh operation is different from a level of the bit line bias voltage in the read operation.

18. A memory device, comprising:
a plurality of word lines extending in a first direction;
a plurality of bit lines extending in a second direction intersecting the first direction;
a plurality of memory cells disposed between the plurality of word lines and the plurality of bit lines in a third direction intersecting the first direction and the second direction; and
a peripheral circuit region including a control logic and disposed below the plurality of memory cells in the third direction, the control logic configured to:
control the plurality of memory cells,
when a read command is received from an external controller, determine a selected memory cell from among the plurality of memory cells with reference to an address included in the read command and determine a selected word line and a selected bit line connected to the selected memory cell,
during a first time period, input a first word line bias voltage to the selected word line and input a first bit line bias voltage to the selected bit line,
during a second time period after the first time period, input a second word line bias voltage to the selected word line and input a second bit line bias voltage to the selected bit line, and
determine a level of each of the first word line bias voltage and the first bit line bias voltage based on a time point at which the read command is received.

19. The memory device of claim 18, wherein the control logic is further configured to determine a level of each of the first word line bias voltage and the first bit line bias voltage based on an address included in the read command.

20. The memory device of claim 18,
wherein the control logic is further configured to determine:
an elapsed time after programming of the selected memory cell using a time point at which the read command is received and a time point at which a last write operation is performed on the selected memory cell, and
a level of each of the first word line bias voltage and the first bit line bias voltage based on the elapsed time after the programming.

* * * * *